United States Patent

Nakahata et al.

[11] Patent Number: 5,646,468
[45] Date of Patent: Jul. 8, 1997

[54] DIAMOND-LiTaO₃ SURFACE ACOUSTIC WAVE DEVICE

[75] Inventors: Hideaki Nakahata; Kenjiro Higaki; Satoshi Fujii; Akihiro Hachigo; Shin-ichi Shikata, all of Itami, Japan

[73] Assignee: Sumitomo Electric Industries, Ltd., Japan

[21] Appl. No.: 660,902

[22] Filed: Jun. 7, 1996

Related U.S. Application Data

[63] Continuation of Ser. No. 465,278, Jun. 5, 1995, abandoned.

[30] Foreign Application Priority Data

Jun. 16, 1994 [JP] Japan .................................. 6-134515
Sep. 2, 1994 [JP] Japan .................................. 6-210105

[51] Int. Cl.⁶ .............................. H03H 9/00; H01L 41/08
[52] U.S. Cl. .................... 310/313 A; 310/313 R; 310/360
[58] Field of Search ................... 310/313 R, 313 A, 310/360

[56] References Cited

U.S. PATENT DOCUMENTS

| | | | |
|---|---|---|---|
| 5,160,869 | 11/1992 | Nakahata et al. | 310/313 A |
| 5,294,858 | 3/1994 | Nakahata et al. | 310/313 A |
| 5,320,865 | 6/1994 | Nakahata et al. | 310/313 R |
| 5,329,208 | 7/1994 | Imai et al. | 310/313 R |
| 5,402,029 | 3/1995 | Nakamura et al. | 310/313 R |
| 5,426,340 | 6/1995 | Higaki et al. | 310/313 R |

FOREIGN PATENT DOCUMENTS

| | | | |
|---|---|---|---|
| A 0 435 189 | 7/1991 | European Pat. Off. | H03H 9/02 |
| A 0 556 811 | 8/1993 | European Pat. Off. | H03H 9/02 |
| 1-62911A | 3/1989 | Japan | H03H 9/25 |

*Primary Examiner*—Thomas M. Dougherty
*Attorney, Agent, or Firm*—Pennie & Edmonds

[57] ABSTRACT

The present invention directed to a SAW device comprising a diamond layer and an LiTaO₃ layer, which can be operated at the frequency of 3 GHz or higher, with superior durability and less energy loss. The SAW device for 1st mode surface acoustic wave of a wavelength $\lambda$ (μm) according to the present invention comprises: a diamond layer, an interdigital transducer formed onto the diamond layer, and a polycrystalline C-axis-oriented LiTaO₃ layer formed over the interdigital transducer; wherein the SAW device satisfies a relationship of $0.4 \leq kh_1 \leq 1.2$, where a parameter $kh_1$ is defined as $kh_1 = 2\pi(t_1/\lambda)$, and $t_1$ (μm) is the thickness of the LiTaO₃ layer.

8 Claims, 24 Drawing Sheets

LAYER STRUCTURE 1 AND 2  ($kh_2 = 4.0, 6.0, 8.0$)
(ELECTRODE ARRANGEMENT F)

ELECTRODE ELEMENT INTERSECTION WIDTH : W
ELECTRODE ELEMENT WIDTH : d ( LAYER STRUCTURE 1 )

( LAYER STRUCTURE 2 )

( ELECTRODE ARRANGEMENT A )

( ELECTRODE ARRANGEMENT C )

(ELECTRODE ARRANGEMENT E)

(ELECTRODE ARRANGEMENT F)

(ELECTRODE ARRANGEMENT : A, C, E, F)
($kh_2 = 1.0$)

(ELECTRODE ARRANGEMENT : A, C, E, F)
($kh_2 = 2.0$)

(ELECTRODE ARRANGEMENT A)
(k h₂ = 1.0)

(ELECTRODE ARRANGEMENT C)
($kh_2 = 1.0$)

(ELECTRODE ARRANGEMENT E)
(kh₂ = 3.0)

LAYER STRUCTURE 1 AND 2 ($kh_2 = 4.0, 6.0, 8.0$)
(ELECTRODE ARRANGEMENT : A, C, E, F)

LAYER STRUCTURE 1 AND 2 ($kh_2 = 4.0, 6.0, 8.0$)
(ELECTRODE ARRANGEMENT A)

$kh_1$
LAYER STRUCTURE 1 AND 2 ($kh_2$ =4. 0, 6. 0, 8. 0)
(ELECTRODE ARRANGEMENT C)

LAYER STRUCTURE 1 AND 2 ($kh_2 = 4.0, 6.0, 8.0$)

(ELECTRODE ARRANGEMENT E)

LAYER STRUCTURE 1 AND 2 ($kh_2 = 4.0, 6.0, 8.0$)

(ELECTRODE ARRANGEMENT F)

DIAMOND-LiTaO₃ SURFACE ACOUSTIC WAVE DEVICE

This is a continuation of application Ser. No. 08/465,278, filed Jun. 5, 1995, now abandoned.

BACKGROUND OF THE INVENTION

1. Field of the Invention

The present invention relates to an improved surface acoustic wave device which comprises LiTaO₃ and diamond.

2. Description of the Related Art

A surface acoustic wave device (SAW device) is a device which utilizes the acoustic wave propagation and the piezoelectricity on the surface of particular solid materials. The SAW device has excellent temperature stability, durability, and phase characteristics. Thus, there are certain demands, in the field of the advanced communication technology, for SAW devices which can be used in high frequency bands of more than 3 GHz, such as band-stop filters, resonators, delay devices, signal processing devices, convolvers, and functional elements for optoelectronic devices. For example, the band-stop filter with wider bandwidth is necessary for the equipments for cellular communications which are typically operated in high frequency bands of more than 3 GHz.

The SAW devices typically comprises interdigital transducers(IDT) for generating and detecting the surface acoustic wave. The operation frequency(f) of a SAW device is given by the equation : $f = V/\lambda$, where V is the wave propagation velocity in the SAW device, and $\lambda$ is the wavelength of the surface acoustic wave. The operation frequency of more than 3 GHz is required for SAW device to be used for the band-stop filters with wider bandwidth. The wavelength $\lambda$ is generally proportional to the width (d) of electrodes of the interdigital transducer.

Because of difficulties on microfabrication technique, the electrode with the width (d) of less than 0.5 µm is difficult to be obtained, thus it is difficult to achieve desirable operation frequency (f) of more than 3 GHz by decreasing wavelength $\lambda$. Therefore, the SAW device with higher propagation velocity V of not less than 7,000 m/s is required for being applied to the operation at the frequency of 3 GHz or higher.

The energy transform (piezoelectrical) efficiency is also important for SAW device to be used for the advanced communication equipments. The effective coupling coefficient($K^2$) is an index to conversion efficiency of the converting of electrical energy into mechanical energy on the surface of the device, and higher $K^2$ of at least 2% or more is thus required for the use of the SAW device in particular in the cellular communication equipments with less energy loss.

The theoretical and the experimental evaluation on surface acoustic wave properties of SAW devices, which includes ZnO for piezoelectrical material and saphire, is disclosed by Mitsuyu et.al.(Mitsuyu,T., S Ono and K Wasa, J. Appl. Phys, 2464–2470,51(5), May 1980). The reference teaches that the saphire-ZnO SAW device can be used for filter with 1050 MHz center frequency. However, Mitsuyu did not teach the SAW device which can be operated at the frequency of 3 MHz or higher. Consequently, a different constitution of SAW device is necessary for the operation at higher frequency.

Diamond is a material which have higher sonic propagation properties than other materials for SAW device, such as saphire.

LiTaO₃ has advantages that the chemical resistance is superior to that of other piezoelectrical materials such as ZnO. Therefore, the SAW devices comprising LiTaO₃ layer as piezoelectrical material and diamond are expected in particular to be used for cellular communications, because of its durability. An SAW device having a laminate structure of a diamond layer and an LiTaO₃ layer is disclosed in the art (Japanese Laid-open Patent Application No.62911/1989). The references, however, did not teach the SAW device which can be used for the communication equipments of higher frequency bands, such as cellular phones.

An objective of the present invention is therefore to provide a SAW device comprising an LiTaO₃ layer as a piezoelectric material, which have improved propagation velocity (V), and improved effective coupling coefficient ($K^2$).

Another objective of the present invention is to provide a SAW devices which has excellent properties for the operation at the frequency of 3 MHz or higher.

SUMMARY OF THE INVENTION

Our invention is, therefore directed to a SAW device comprising a diamond layer and an LiTaO₃ layer, which can be operated at the frequency of 3 GHz or higher, with superior durability and less energy loss.

We have evaluated desirable range of the LiTaO₃ layer thickness for providing desired operation frequency with less energy loss, by using a parameter $kh_1$, which is defined as $kh_1 = 2\pi(t_1/\lambda)$, where $t_1$ (µm) is the thickness of the LiTaO₃ layer and $\lambda$ is the wavelength of the surface acoustic wave. This parameter is appropriate in the present invention for determining the desirable thickness with the specified wavelength propagating across the surface of SAW device.

We have also evaluated desirable range of the diamond layer thickness for providing desired operation frequency with less energy loss, by using a parameter $kh_2$, which is defined as $kh_2 = 2\pi(t_1/\lambda)$, where $t_2$ (µm) is the thickness of the diamond layer and $\lambda$ is the wavelength of the surface acoustic wave.

The desirable ranges of LiTaO₃ layer thickness or diamond layer thickness depend on the mode of surface acoustic wave and the constitution of layers/IDT, respectively. Consequently, the evaluation was carried out by mode of surface acoustic wave and by the constitution of the SAW device.

The SAW device for 1st mode surface acoustic wave of a wavelength $\lambda$ (µm) according to the present invention comprises:

a diamond layer, an interdigital transducer formed onto the diamond layer, and a polycrystalline C-axis-oriented LiTaO₃ layer formed over the interdigital transducer;

wherein the SAW device satisfies a relationship of $0.4 \leq kh_1 \leq 1.2$, where a parameter $kh_1$ is defined as $kh_1 = 2\pi(t_1/\pi)$, and $t_1$ (µm) is the thickness of the LiTaO₃ layer.

The SAW device having above structure can provides a SAW propagation velocity V of from 7,000 m/s to 2,000 m/s, and an effective coupling coefficient $K^2$ of from 2.0% to 3.6%.

The SAW device for 2nd mode surface acoustic wave of a wavelength $\lambda$ (µm) according to the present invention includes the same constitution of the above SAW device for 1st mode SAW; wherein the SAW device satisfies a relationship of $1.0 \leq kh_1 \leq 2.3$.

The SAW device having this structure can provides a SAW propagation velocity V of from 8,000 m/s to 11,000 m/s, and an effective coupling coefficient $K^2$ of from 1.0% to 3.4%.

Another SAW device for 2nd mode surface acoustic wave of a wavelength λ (μm) according to the present invention further comprises a substrate, onto which the diamond layer is formed;

wherein the SAW device satisfies a relationship of $1.0 \leq kh_1 \leq 2.3$, where a parameter $kh_1$ is defined as $kh_1 = 2\pi(t_1/\lambda)$, and $t_1$ (μm) is the thickness of the LiTaO$_3$ layer;

and wherein the SAW device satisfies a relationship of $4 \leq kh_2$, where a parameter $kh_2$ is defined as $kh_2 = 2\pi(t_2/\lambda)$, and $t_2$ (μm) is the thickness of the diamond layer.

The SAW device having this structure can provide a SAW propagation velocity V of from 8,000 m/s to 11,000 m/s, and an effective coupling coefficient K$^2$ of from 1.0% to 3.4%.

Another SAW device for 1st mode surface acoustic wave of a wavelength λ (μm) according to the present invention comprises:

a diamond layer, a polycrystalline C-axis-oriented LiTaO$_3$ layer formed onto the diamond layer, and an interdigital transducer formed onto the LiTaO$_3$ layer;

wherein the SAW device satisfies a relationship of $0.4 \leq kh_1 \leq 1.2$, where a parameter $kh_1$ is defined as $kh_1 = 2\pi(t_1/\lambda)$, and $t_1$ (μm) is the thickness of the LiTaO$_3$ layer.

The SAW device having above structure can provides a SAW propagation velocity V of from 7,000 m/s to 12,000 m/s, and an effective coupling coefficient K$^2$ of from 3.0% to 4.6%.

Another SAW device for 2nd mode surface acoustic wave of a wavelength λ (μm) according to the present invention includes the same constitution of the above SAW device for 1st mode SAW; wherein the SAW device satisfies a relationship of $1.0 \leq kh_1 \leq 2.3$.

The SAW device having this structure can provides a SAW propagation velocity V of from 8,000 m/s to 11,000 m/s, and an effective coupling coefficient K$^2$ of from 1.0% to 2.6%.

Further, another SAW device for 2nd mode surface acoustic wave of a wavelength λ (μm) according to the present invention further comprises a substrate, onto which the diamond layer is formed;

wherein the SAW device satisfies a relationship of $1.0 \leq kh_1 \leq 2.3$, where a parameter $kh_1$ is defined as $kh_1 = 2\pi(t_1/\lambda)$, and $t_1$ (μm) is the thickness of the LiTaO$_3$ layer;

and wherein the SAW device satisfies a relationship of $4 \leq kh_2$, where a parameter $kh_2$ is defined as $kh_2 = 2\pi(t_2/\lambda)$, and $t_2$ (μm) is the thickness of the diamond layer.

The SAW device having this structure can provide a SAW propagation velocity V of from 8,000 m/s to 11,000 m/s, and an effective coupling coefficient K$^2$ of from 1.0% to 2.6%.

Another SAW device for 1st mode surface acoustic wave of a wavelength λ (μm) according to the present invention comprises:

a diamond layer, an electrode film formed over the diamond layer, a polycrystalline C-axis-oriented LiTaO$_3$ layer formed onto the electrode film, and an interdigital transducer formed onto the LiTaO$_3$ layer;

wherein the SAW device satisfies a relationship of $0.6 \leq kh_1 \leq 1.2$, where a parameter $kh_1$ is defined as $kh_1 = 2\pi(t_1/\lambda)$, and $t_1$ (μm) is the thickness of the LiTaO$_3$ layer.

The SAW device having above structure can provides a SAW propagation velocity V of from 7,000 m/s to 11,000 m/s, and an effective coupling coefficient K$^2$ of from 1.0% to 1.6%.

Another SAW device for 2nd mode surface acoustic wave of a wavelength λ (μm) according to the present invention includes the same constitution of the above SAW device for 1st mode SAW;

wherein the SAW device satisfies a relationship of $1.5 \leq kh_1 \leq 3.0$.

The SAW device having this structure can provides a SAW propagation velocity V of from 7,000 m/s to 10,000 m/s, and an effective coupling coefficient K$^2$ of from 1.0% to 2.0%.

Another SAW device for 2nd mode surface acoustic wave of a wavelength λ (μm) according to the present invention further comprises a substrate, onto which the diamond layer is formed;

wherein the SAW device satisfies a relationship of $1.5 \leq kh_1 \leq 3.0$, where a parameter $kh_1$ is defined as $kh_1 = 2\pi(t_1/\lambda)$, and $t_1$ (μm) is the thickness of the LiTaO$_3$ layer;

and wherein the SAW device satisfies a relationship of $4 \leq kh_2$, where a parameter $kh_2$ is defined as $kh_2 = 2\pi(t_2/\lambda)$, and $t_2$ (μm) is the thickness of the diamond layer.

The SAW device having this structure can provide a SAW propagation velocity V of from 7,000 m/s to 10,000 m/s, and an effective coupling coefficient K$^2$ of from 1.0% to 2.0%.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

The present invention will be described in detail as following, with reference to the accompanying drawings.

(Mode for SAW)

In a SAW device according to the present invention, various kinds of waves of different propagation velocities are produced. Therefore, surface acoustic wave of the smallest propagation velocity V is defined as "zero-th mode SAW", SAW of the second smallest propagation velocity V is defined as "1st-mode SAW", a kind of SAW having the third smallest propagation velocity V is referred to as "2nd-mode SAW".

Figure 1:
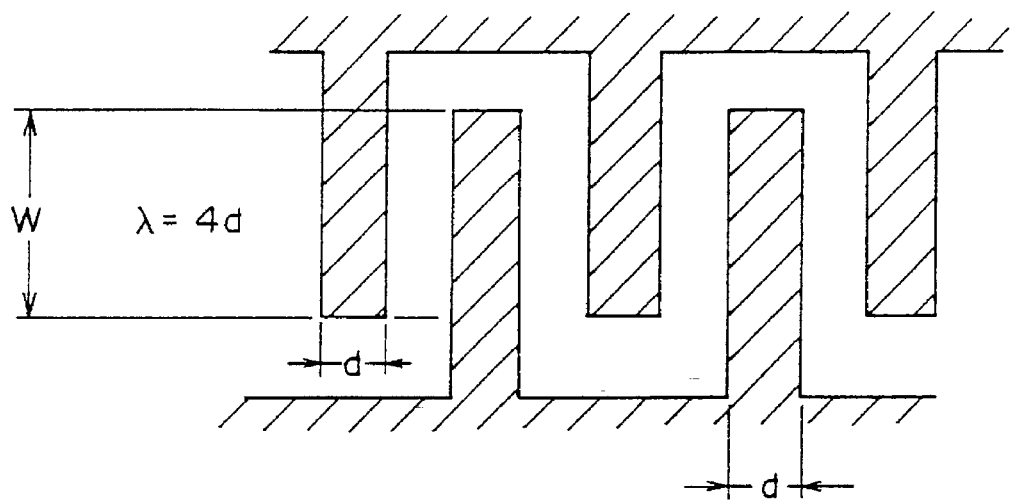
FIG. 1 is a schematic plan view showing an example of the planar shape of an IDT (single-type electrode) constituting a SAW device.
Figure 2:
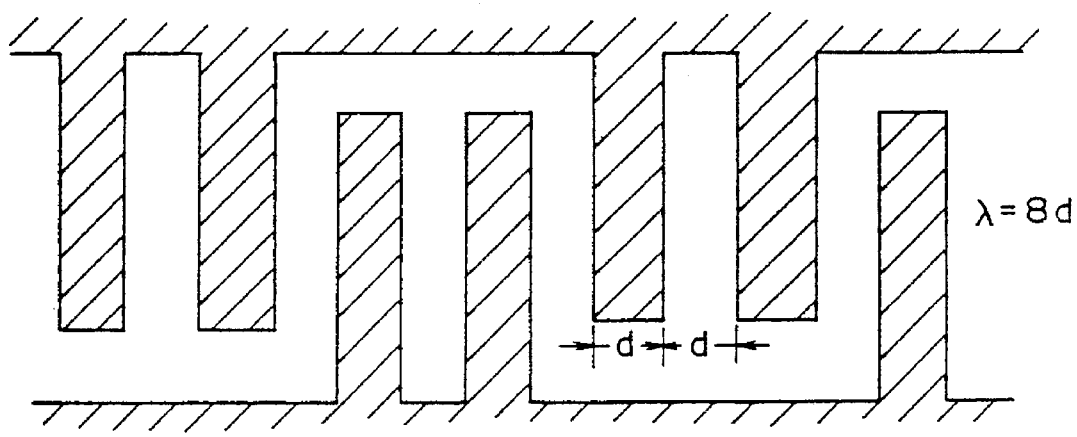
FIG. 2 is a schematic plan view showing an example of the planar shape of an IDT (double-type electrode) constituting a SAW device.

Accordingly, the mode of wave mainly used for a SAW device can be determined by measuring the propagation velocity V of the SAW at an operating frequency of the SAW device. For Example, the propagation velocity V may be determined by using a relationship of $V=f\lambda$, wherein f denotes the center frequency, and $\lambda$ denotes the wavelength which depends on the electrode (element) width of the IDT. In a case where the IDT constituting a SAW device comprises a single-type electrode having a planar shape as shown in FIG. 1 (electrode element width=d), $\lambda=4d$. In a case where the IDT constituting a SAW device comprises a double-type electrode having a planar shape as shown in FIG. 2 (electrode element width=d), $\lambda=8d$.

(Layer Constitution)

Figure 3:
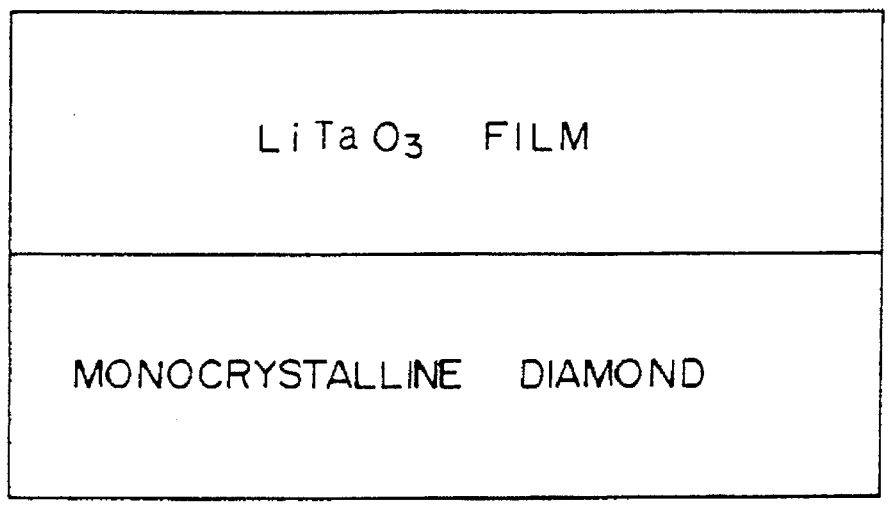
FIG. 3 is a schematic sectional view showing a layer structure (Layer Structure 1) of an embodiment of the SAW device according to the present invention.

FIG. 3 is a schematic sectional view showing an example of the layer (or laminate) structure ("Layer Structure 1") of a SAW device according to the present invention. Referring to FIG. 3, the SAW device comprises at least, diamond, an $LiTaO_3$ layer disposed on the diamond, and an IDT (not shown) disposed in the device, contacting to the $LiTaO_3$ layer. This SAW device utilizes SAW of an "n-th" mode (n=1 or 2) having a wavelength of $\lambda_n$ (μm). A parameter of $kh_1=2\pi(t_1/\lambda_n)$ is used to specifically determine the desired thickness of the $LiTaO_3$ layer for certain mode of wave, where the thickness of the $LiTaO_3$ layer is $t_1$ (μm).

Figure 4:
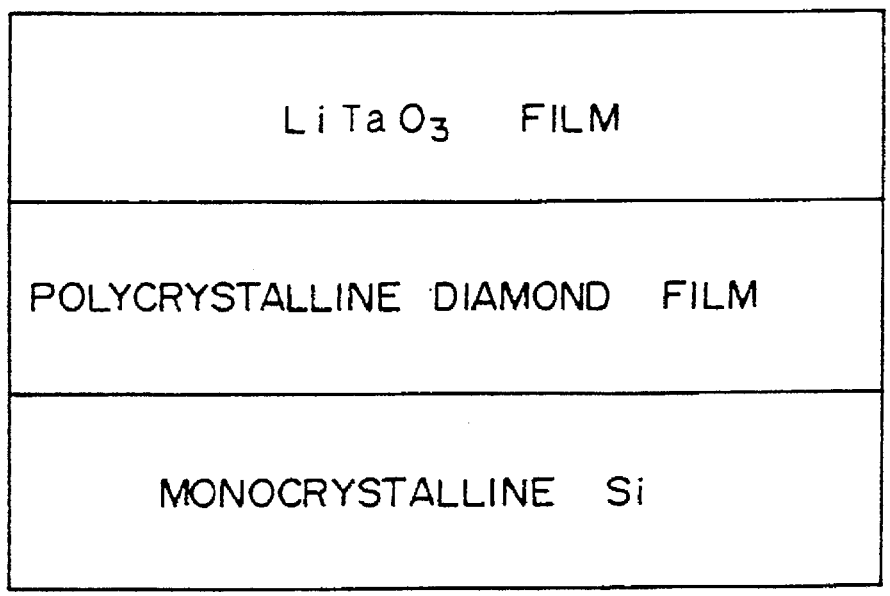
FIG. 4 is a schematic sectional view showing a layer structure (Layer Structure 2) of an embodiment of the SAW device according to the present invention.

In another embodiment of the present invention (as illustrated in FIG. 4, i.e., Layer Structure 2), further comprising a substrate (or base material), a parameter of $kh_2=2\pi(t_2/\lambda_n)$ is used to specifically determine the desired thickness of the $LiTaO_3$ layer for certain mode of wave, where the thickness of a diamond layer is $t_2$ (μm).

The desirable range of the parameters $kh_1$ and $kh_2$ are evaluated for specific wave mode and for specific constitution, in order to determine the SAW devices available for operating at high frequency bands of 3 GHz or higher with less energy loss.

(Electrode Arrangement)

In the SAW device according to the present invention, it is preferred to select an electrode arrangement of IDT and a electrode film for short-circuiting as desired, from those shown in the schematic sectional views of FIGS. 5 to 8.

Figure 5:
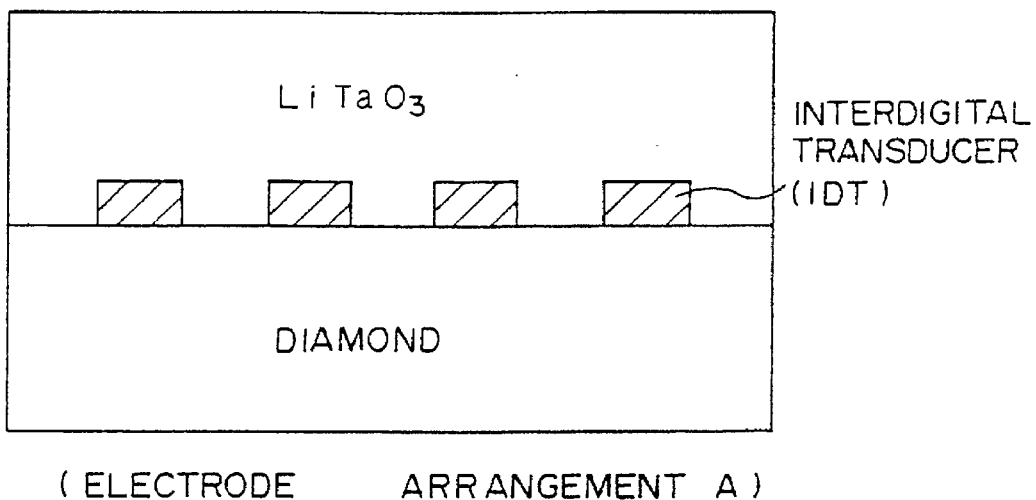
FIG. 5 is a schematic sectional view showing an electrode arrangement (Electrode Arrangement A) of an embodiment of the SAW device according to the present invention.

In the arrangement (Electrode Arrangement A) shown in FIG. 5, the SAW device comprises diamond layer, an IDT disposed on the diamond layer, and an LiTaO$_3$ layer disposed on the IDT. The arrangement (Electrode Arrangement C) shown in FIG. 6 further comprises a short-circuiting electrode disposed on the LiTaO$_3$ layer constituting the "Electrode Arrangement A".

Figure 7:
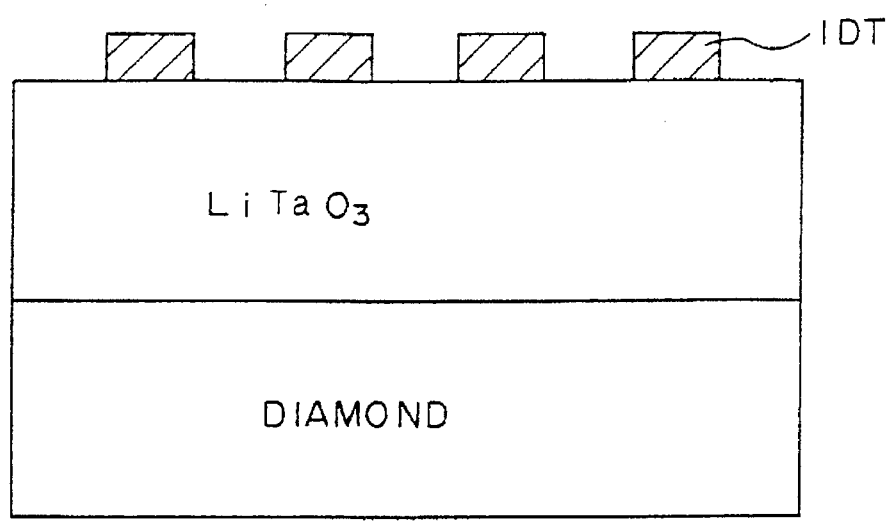
FIG. 7 is a schematic sectional view showing an electrode arrangement (Electrode Arrangement E) of an embodiment of the SAW device according to the present invention.

In the arrangement (Electrode Arrangement E) shown in FIG. 7, the SAW device comprises diamond layer, an LiTaO$_3$ layer disposed on the diamond layer, and an IDT disposed on the LiTaO$_3$ layer. The arrangement (Electrode Arrangement F) shown in FIG. 8 further comprises a short-circuiting electrode disposed between the diamond layer and the LiTaO$_3$ layer constituting the "Electrode Arrangement E".

(Constitution of Layers)

The layers constituting the SAW device according to the present invention will be described in detail.

(Diamond)

In the present invention, the diamond layer may comprise monocrystalline diamond and/or polycrystalline diamond. The process or method for providing or producing diamond is not particularly limited. Typically, the diamond may comprise monocrystalline diamond, or a diamond film as a polycrystalline film or epitaxial film which has been grown onto substrate of another material(base material) by vapor-phase deposition processes.

The base material used for forming diamond film is not particularly limited, but may appropriately be selected depending on the usage of the SAW device. For example, the base material to be available in the present invention may comprise semiconductor such as crystalline silicon, amorphus silicon, metal, glass, ceramic, etc.

In a case where the above diamond comprises a diamond film, the process or method for growing the diamond (thin) film is not particularly limited. Typically, the process may appropriately be selected from known growth processes of CVD (Chemical Vapor Deposition) including microwave plasma CVD, PVD (Physical Vapor Deposition), sputtering, ion plating, plasma jet method, flame method, hot filament method, etc.

The plane orientation of the diamond or diamond film available for the present invention is not limited. For example, the plane orientation of the diamond (film) may be any of (111), (100) and (110), etc., and may be any combination of these plane orientations.

(Orientation of LiTaO$_3$ Film)

In the present invention, the LiTaO$_3$ film to be disposed on the diamond is polycrystalline, and comprises an LiTaO$_3$ film wherein the (001) plane thereof is parallel to the diamond layer surface or the substrate surface (C-axis-oriented LiTaO$_3$ film), in view of piezoelectric property.

The orientation of an LiTaO$_3$ film can typically be evaluated by X-ray rocking (curve) pattern method. More specifically, the orientation (in-plane orientation) may be evaluated in the following manner.

(1) A sample to be measured is placed in a sample holder of an X-ray diffractometer.

(2) The plane orientation of a face to be evaluated is measured by using an X-ray diffraction pattern method utilizing the X-ray diffractometer.

(3) The θ-axis (corresponding to the rotation of the sample to be measured) and the 2θ-axis (corresponding to an X-ray counter of the X-ray diffractometer) are rotated and then fixed so that the θ- and 2θ-axes provide a maximum output value in orientation of the face to be evaluated. In the case of an LiTaO$_3$ film of which C-axis is oriented perpendicularly to a base substance on which the LiTaO$_3$ film is to be disposed, 2θ is 39° with respect to the (006) peak.

(4) The sample (i.e., the θ-axis) is rotated and a rocking curve is obtained.

(5) The obtained rocking curve is assumed to one having a Gaussian distribution, and a standard deviation σ is determined (Details of the rocking curve is referred to "Preparation of ZnO Films by an Activated Reactive Evaporation Method" Miura,Y. et al.; "ZAIRYO" (Materials), 40, No. 451 (April, 1991), Japan).

When the standard deviation σ of the rocking curve measured in the above-described manner is smaller, it indicates a higher orientation of the sample (LiTaO$_3$) to be evaluated. In the SAW device according to the present invention, the σ value may preferably be 8° or less (more preferably, 4° or less).

(IDT)

Any of electroconductive materials can be used for interdigital transducer for the SAW device of the present invention. In view of processability, Al (aluminum) may preferably be used as the material for the IDT.

The thickness of the IDT is not limited, as long as it functions as an IDT of a SAW device. In general, the thickness of the IDT may typically be in the range of about 100 to about 5,000 Å (more preferably, about 100 to 500 Å). When the thickness of the IDT is less than 100 Å, the electrode resistivity is increased, causing considerable energy loss. On the other hand, when the thickness of the IDT exceeds 5,000 Å, considerable mass addition effect cause reflection of SAW, and desired SAW characteristic of the SAW device may suffer.

The planar or projected shape of the IDT for the SAW device of the present invention is not limited. Electrode called "single-type" electrode as shown in the schematic plan view of FIG. 1 or electrode called "double-type" electrode as shown in the schematic plan view of FIG. 2 may typically be used for the present invention.

Desirable manner is that the IDT may be embedded in a surface (for example, a surface of diamond having a specific orientation such as (111)) on which the IDT is to be disposed. For example, a recessed or indented portion such as groove may be formed, or a predetermined surface having a recessed portion may be formed in advance, and at least a part of a conductive material such as Al of the IDT may be embedded in the recessed portion. When all or a part of the IDT is embedded in this manner, the surface level or height of the IDT can be made substantially equal to the surface on which the IDT is to be formed, and eventually influences for SAW reflection caused by the thickness of the IDT can be reduced.

(Short-Circuiting Electrode)

The short-circuiting electrode to be disposed as desired, is an electrode having a function of providing an equipotential state to an electric field so as to change the SAW characteristics of the device. This electrode may preferably comprise a (thin) film of a metal such as Al, Au or Al—Cu. Since the short-circuiting electrode has a function different from that of the IDT, the material of the short-circuiting electrode may not be same as that of the IDT.

The thickness of the short-circuiting electrode is not particularly limited, as long as it may function as a short-circuiting electrode of a SAW device. The thickness of the short-circuiting electrode may preferably be in the range of about 50 to 3,000 Å (more preferably, about 100 to 500 Å). When the thickness is less than 50 Å, it is difficult to obtain an equipotential state as described above. On the other hand, when the thickness exceeds 3,000 Å, it may affect the reflection of SAW.

For example, the short-circuiting electrode may preferably has a planner shape of a "solid electrode" having an area substantially equal to that of the IDT to be used in combination therewith.

EXAMPLES

Example 1

Four types of SAW devices of different layer/IDT constitution were prepared, and the desired diamond/LiTaO$_3$ layer thickness for each constitution/each mode of SAW were evaluated to give sufficient propagation velocity (V) and excellent effective coupling coefficient K$^2$, by use of the parameter kh$_1$ and kh$_2$.

Figure 6:
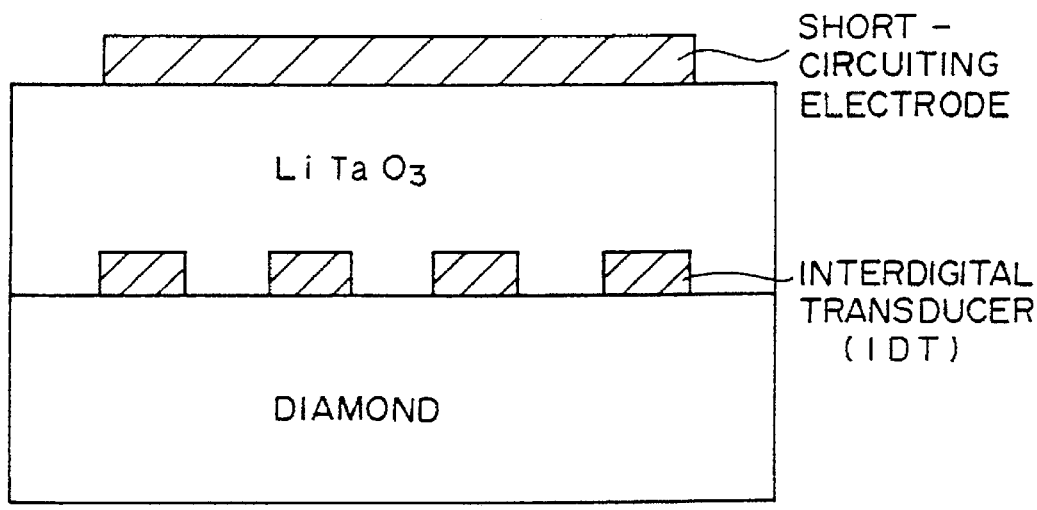
FIG. 6 is a schematic sectional view showing an electrode arrangement (Electrode Arrangement C) of an embodiment of the SAW device according to the present invention.
Figure 8:
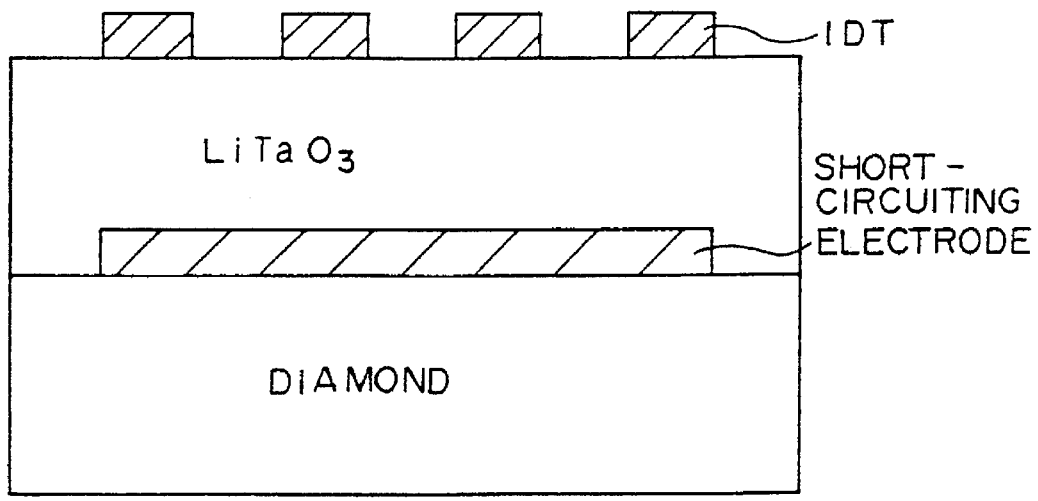
FIG. 8 is a schematic sectional view showing an electrode arrangement (Electrode Arrangement F) of an embodiment of the SAW device according to the present invention.

The four types of the SAW devices of the Example 1 are:

(1) SAW device having Layer Structure 2 as illustrated in FIG. 4, and an Electrode Arrangement A as illustrated in FIG. 5;

(2) SAW device having Layer Structure 2 as illustrated in FIG. 4, and an Electrode Arrangement C as illustrated in FIG. 6;

(3) SAW device having Layer Structure 2 as illustrated in FIG. 4, and an Electrode Arrangement E as illustrated in FIG. 7;

(4) SAW device having Layer Structure 2 as illustrated in FIG. 4, and an Electrode Arrangement F as illustrated in FIG. 8.

A polycrystalline diamond film was formed on a (100) face of monocrystalline silicon by microwave plasma CVD process. Then the resultant diamond surface was polished, and four diamond films of a thickness between 1.3–5 µm were obtained.

<Process conditions of microwave plasma CVD for diamond layer>

Microwave power: 150 W

Reactant gas: CH$_4$:H$_2$=1:100

Pressure: 40 Torr

Temperature: 850° C.

Film thickness (after the surface polishing): 1.3 µm, 2.6 µm, 3.8 µm, and 5.1 µm Aluminum IDTs having planer shape of double-type electrode as shown in FIG. 2(electrode element width d=1 µm, pitch=8 µm, thickness=400 Å) were formed on each of the formed diamond films. Then an LiTaO$_3$ film (film thickness: 0.13–5.1 µm, 40 thicknesses) was formed over the IDTs by RF magnetron sputtering process.

<Process conditions of RF magnetron sputtering of LiTaO$_3$>

Pressure: 1×10$^{-2}$ Torr

Substrate temperature: 650° C.

Ar:O$_2$=1:1

RF power: 150 W

Target: Li:Ta=1:1 sintered product

Film thickness: film thicknesses corresponding to values obtained by dividing the thickness of 0.13 µm to 5.1 µm (difference: 4.97 µm) into 40 equal parts (i.e., thicknesses of 0.13 µm, (0.13+4.97×$^1$/$_{40}$)µm, (0.13+4.97×$^2$/$_{40}$)µm, . . . , (0.13+4.97×$^{39}$/$_{40}$)µm, and 5.1 µm).

All of the formed LiTaO$_3$ films were C-axis oriented films, and the σ value of the X-ray rocking curve of each LiTaO$_3$ film was evaluated to obtain 2°–3°.

The resultant SAW device has a layer structure (Layer Structure 2) as shown in FIG. 4, and an electrode arrangement (Electrode Arrangement A) as shown in FIG. 5 (input IDT: 30 electrode pairs, output IDT: 30 electrode pairs, distance between centers of input and output electrodes: 400 µm).

An aluminum short-circuiting electrode having a thickness of 100 Å was further formed, and the SAW devices having a layer structure as shown in FIG. 4 (Layer Structure 2) and an electrode arrangement as shown in FIG. 6 (Electrode Arrangement C) were obtained.

SAW devices having a layer structure as shown in FIG. 4 (Layer Structure 2) and an electrode arrangement as shown in FIG. 7 (Electrode Arrangement E), and SAW devices having a layer structure as shown in FIG. 4 (Layer Structure 2) and an electrode arrangement as shown in FIG. 8 (Electrode Arrangement F) were fabricated in the same manner as described above, except for changing the order of the respective layer formation.

With respect to each of the SAW devices of the four types of SAW devices, radio frequency was applied to the input IDT to generate SAW. The propagation velocities V (m/s) of the generated SAW of respective modes were determined depending on a relationship of V=f×λ (f: center frequency, λ=8d=8 µm).

The effective coupling coefficient (K$^2$) was also evaluated by measuring the radiation conductance (wherein the real part is denoted by "G") of the IDT by using a network analyzer (trade name: Network Analyzer 8719A, available from Yokogawa Hewlett Packard (YHP), Japan), and the following formula:

$$K^2=(G/8)\cdot f_0\cdot C\cdot N$$

(f$_0$: center frequency, C: total electrostatic capacitance of IDT, N: number of electrode element pairs of IDT).

The thickness t$_1$ (µm) of the LiTaO$_3$ layers of each SAW devices, and the thickness t$_2$ (µm) of the diamond layers of each SAW device were measured by cutting off the device after the measurement of various parameters as described above, and observing the resultant section of the device with a scanning electron microscope (SEM) at a magnification of 1000–5000×.

On the basis of the obtained data, the values of the parameters of kh$_1$=2π(t$_1$/λ) and kh$_2$=2π(t$_2$/λ) were determined with respect to each of the SAW devices having a layer structure (Layer Structure 2) shown in FIG. 4, and an electrode arrangement (any of Electrode Arrangement A, C, E and F) shown in FIGS. 5–8 (λ=8 µm).

Figure 9:
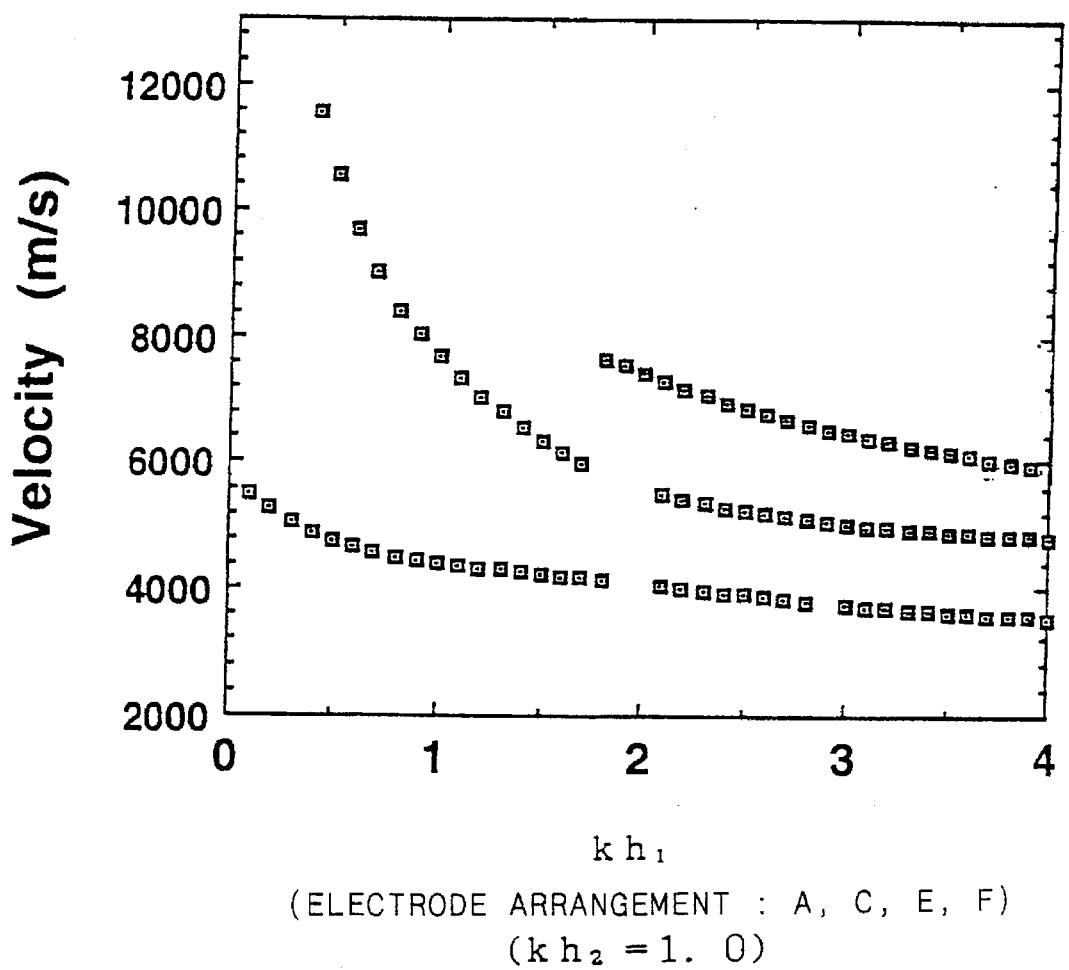
FIG. 9 is a graph showing a relationship of the propagation velocity V of SAW with the parameter $kh_1$ in a SAW device having the "Layer Structure 2" and the "Electrode Arrangement A, C, E or F" (the parameter $kh_2 = 1.0$).
Figure 10:
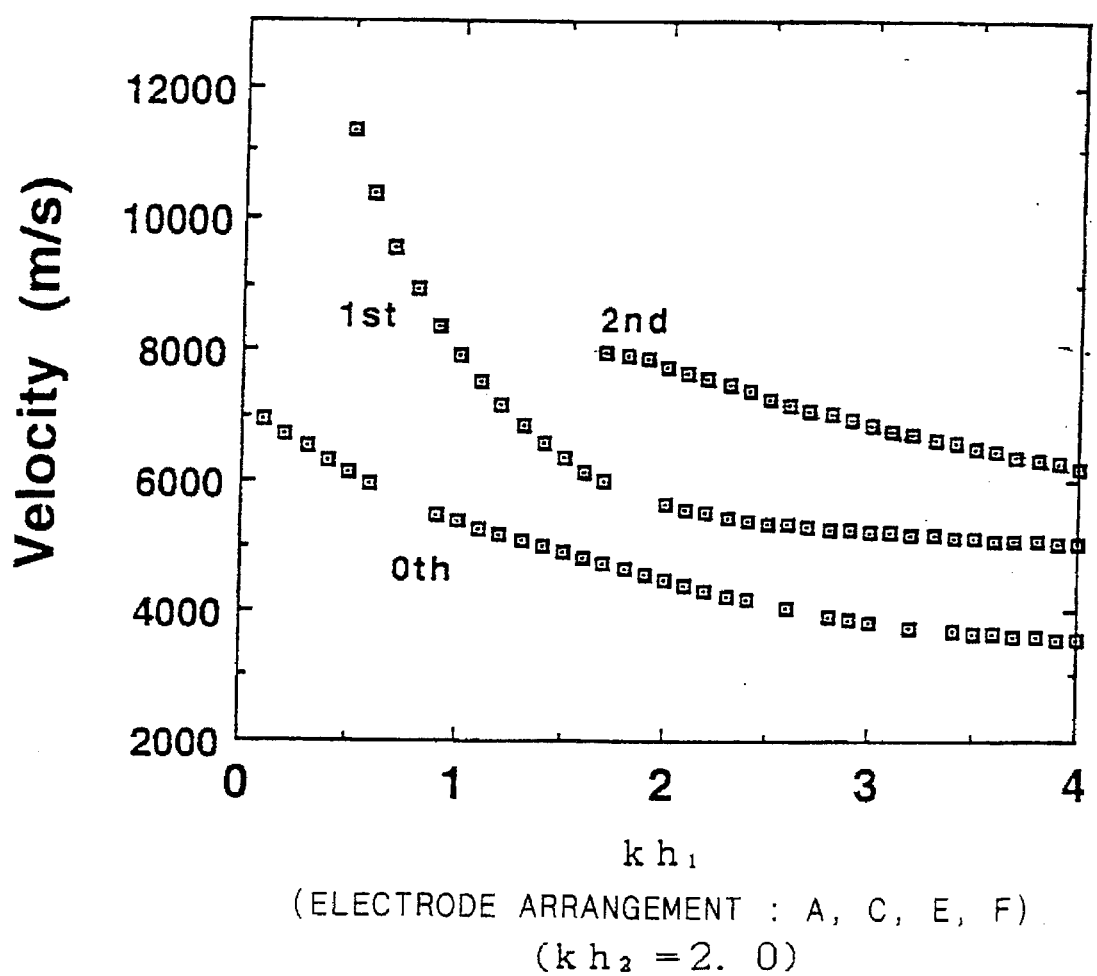
FIG. 10 is a graph showing a relationship of the propagation velocity V of SAW with the parameter $kh_1$ in a SAW device having the "Layer Structure 2" and the "Electrode Arrangement A, C, E or F" (the parameter $kh_2 = 2.0$).
Figure 11:
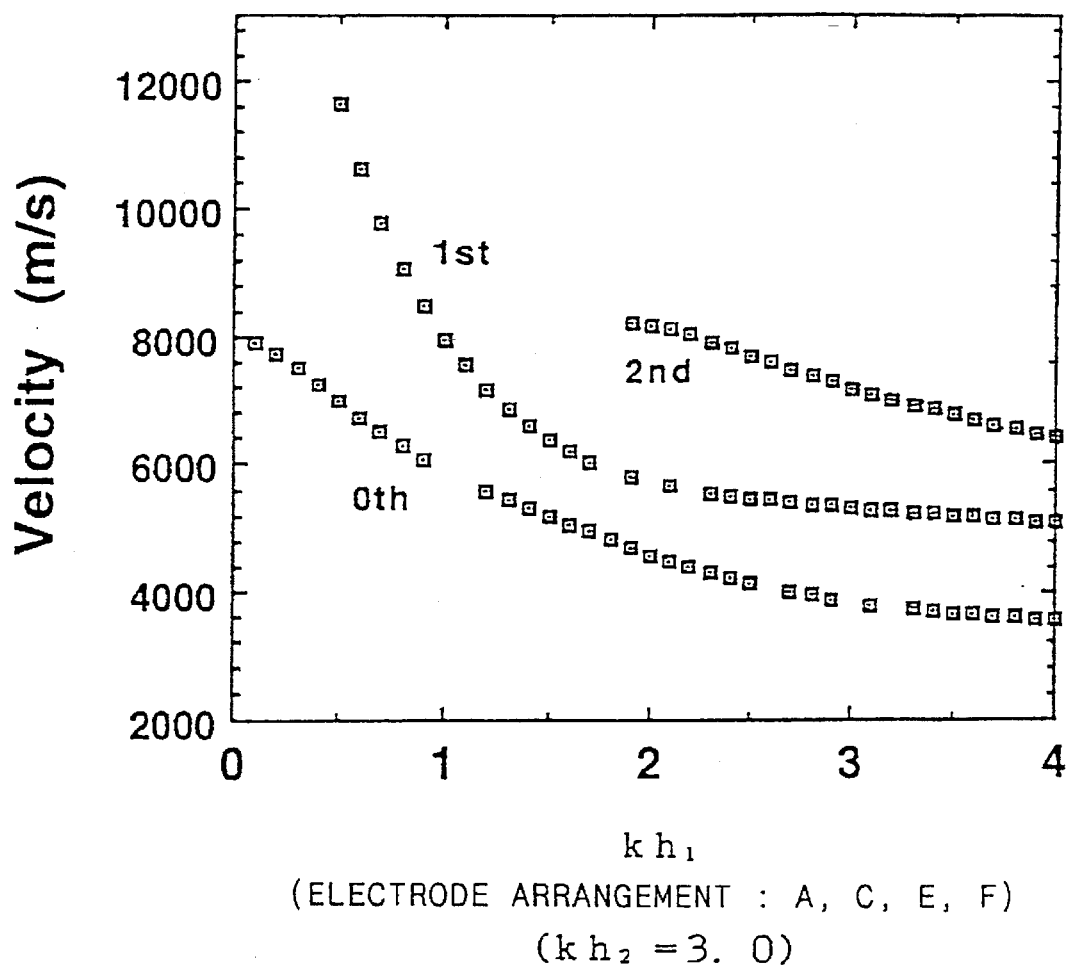
FIG. 11 is a graph showing a relationship of the propagation velocity V of SAW with the parameter $kh_1$ in a SAW device having the "Layer Structure 2" and the "Electrode Arrangement A, C, E or F" (the parameter $kh_2 = 3.0$).

The relationships of the propagation velocity V with the parameters kh$_1$=2π(t$_1$/λk) or kh$_2$=2π(t$_2$/λ) are shown in FIG. 9 (kh$_2$=1.0), FIG. 10 (kh$_2$=2.0) and FIG. 11 (kh$_2$=3.0), respectively.

Figure 12:
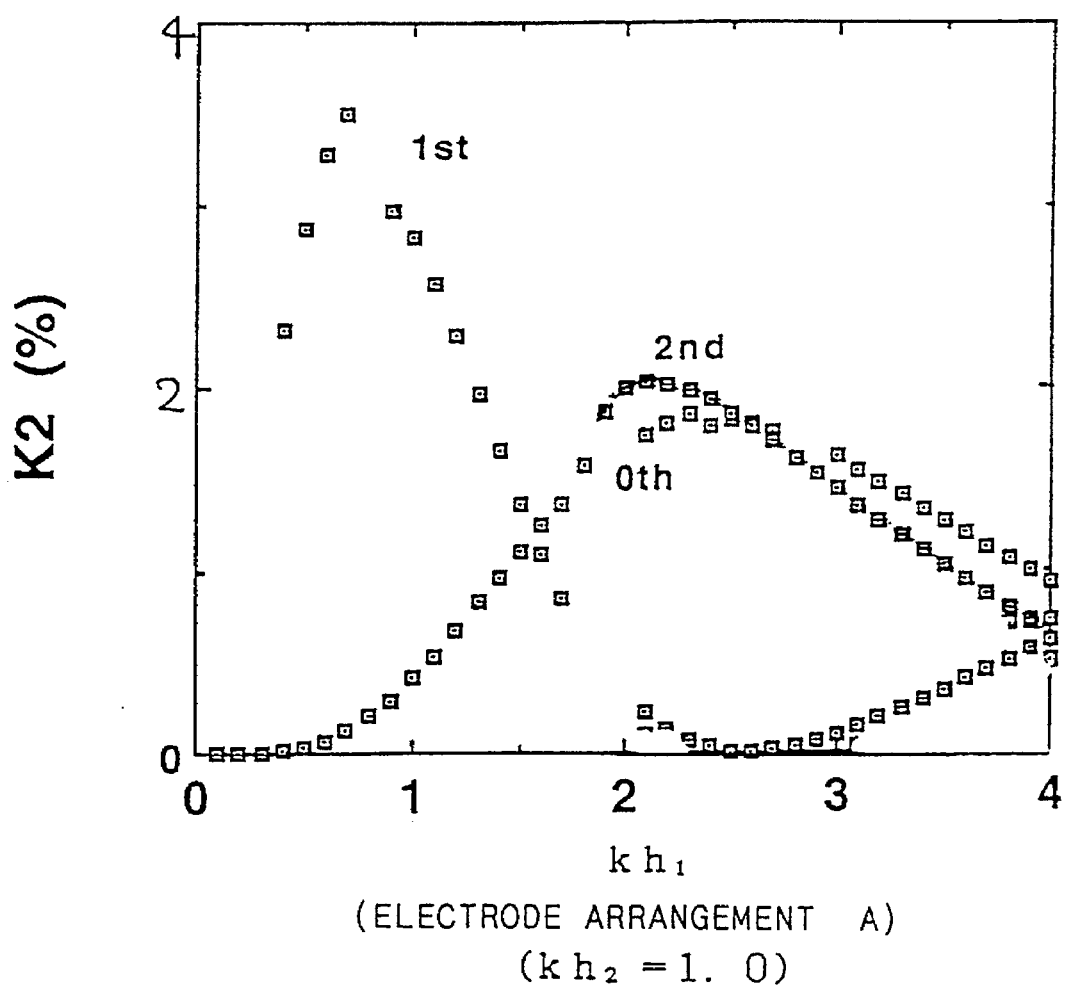
FIG. 12 is a graph showing a relationship of the effective coupling coefficient $K^2$ with the parameter $kh_1$ in a SAW device having the "Layer Structure 2" and the "Electrode Arrangement A" (the parameter $kh_2 = 1.0$).
Figure 13:
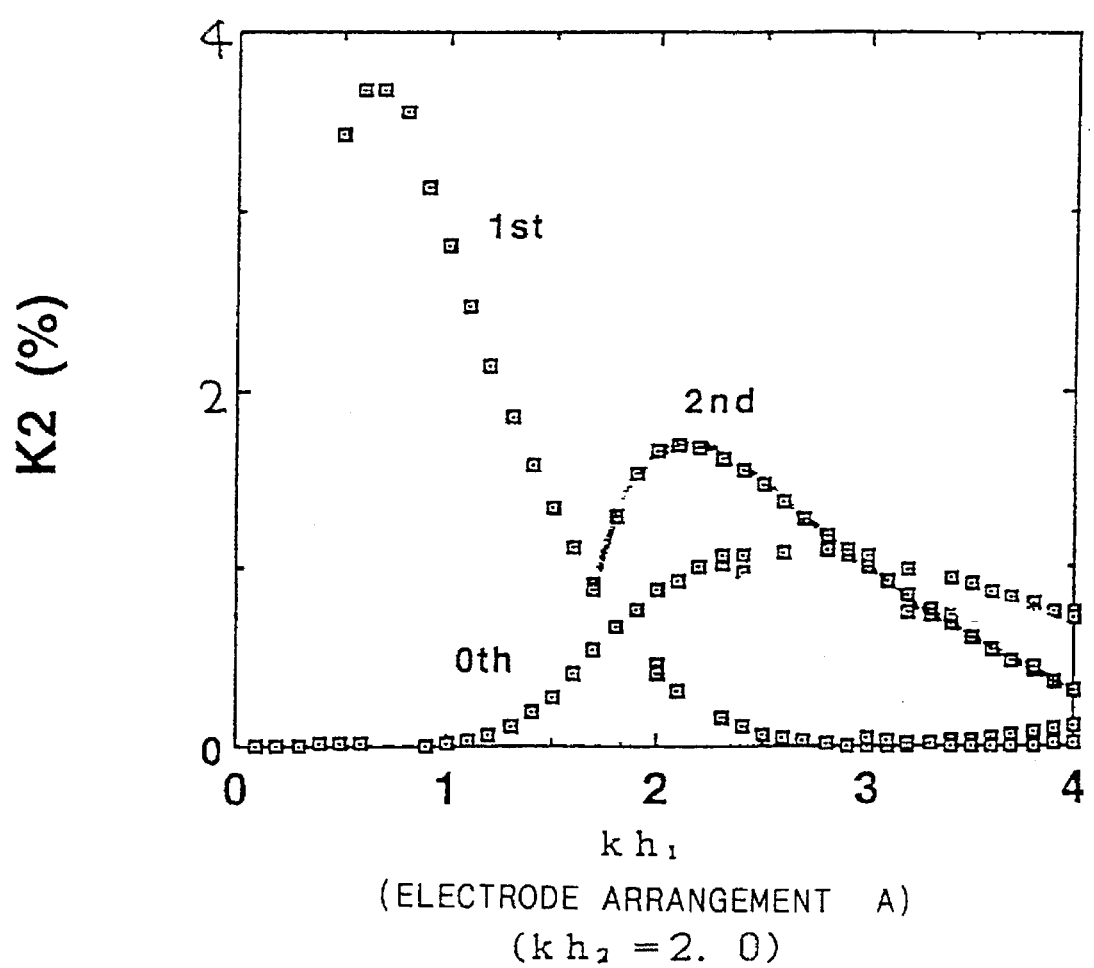
FIG. 13 is a graph showing a relationship of the effective coupling coefficient $K^2$ with the parameter $kh_1$ in a SAW device having the "Layer Structure 2" and the "Electrode Arrangement A" (the parameter $kh_2 = 2.0$).
Figure 14:
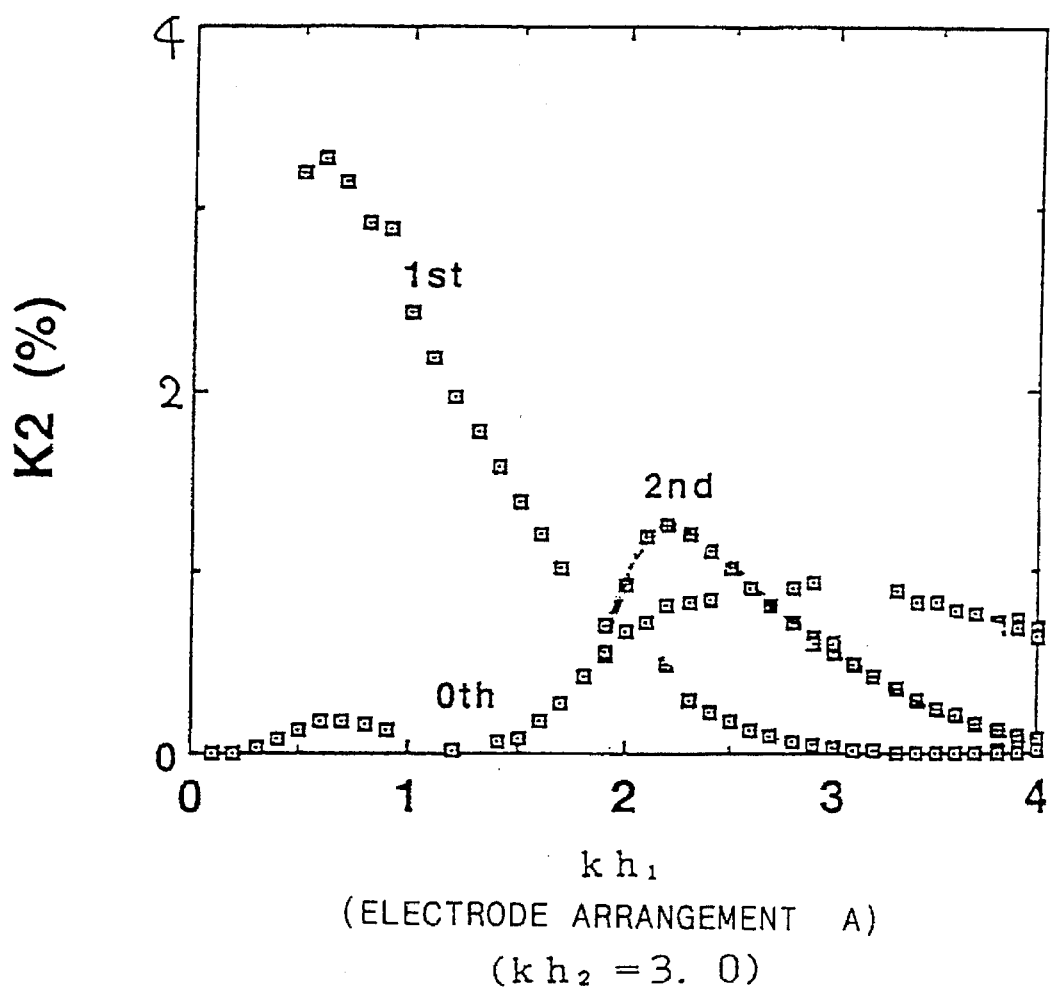
FIG. 14 is a graph showing a relationship of the effective coupling coefficient $K^2$ with the parameter $kh_1$ in a SAW device having the "Layer Structure 2" and the "Electrode Arrangement A" (the parameter $kh_2 = 3.0$).

With respect to the SAW device of Electrode Arrangement A, the relationships of the effective coupling coefficient K$_2$ with the parameter kh$_1$ are shown in FIG. 12 (kh$_2$=1.0), FIG. 13 (kh$_2$=2.0) and FIG. 14 (kh$_2$=3.0), respectively.

Figure 15:
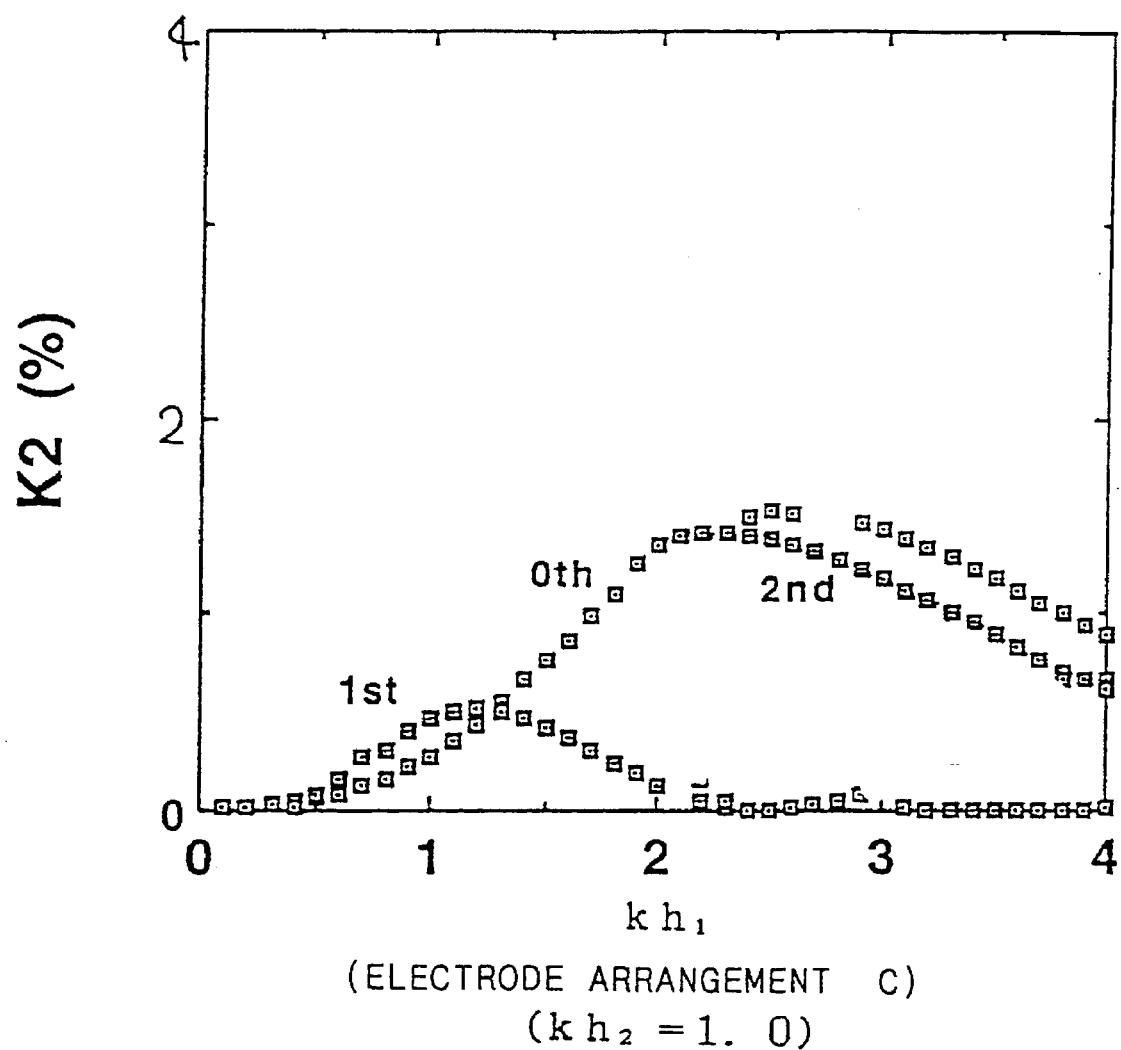
FIG. 15 is a graph showing a relationship of the effective coupling coefficient $K^2$ with the parameter $kh_1$ in a SAW device having the "Layer Structure 2" and the "Electrode Arrangement C" (the parameter $kh_2 = 1.0$).
Figure 16:
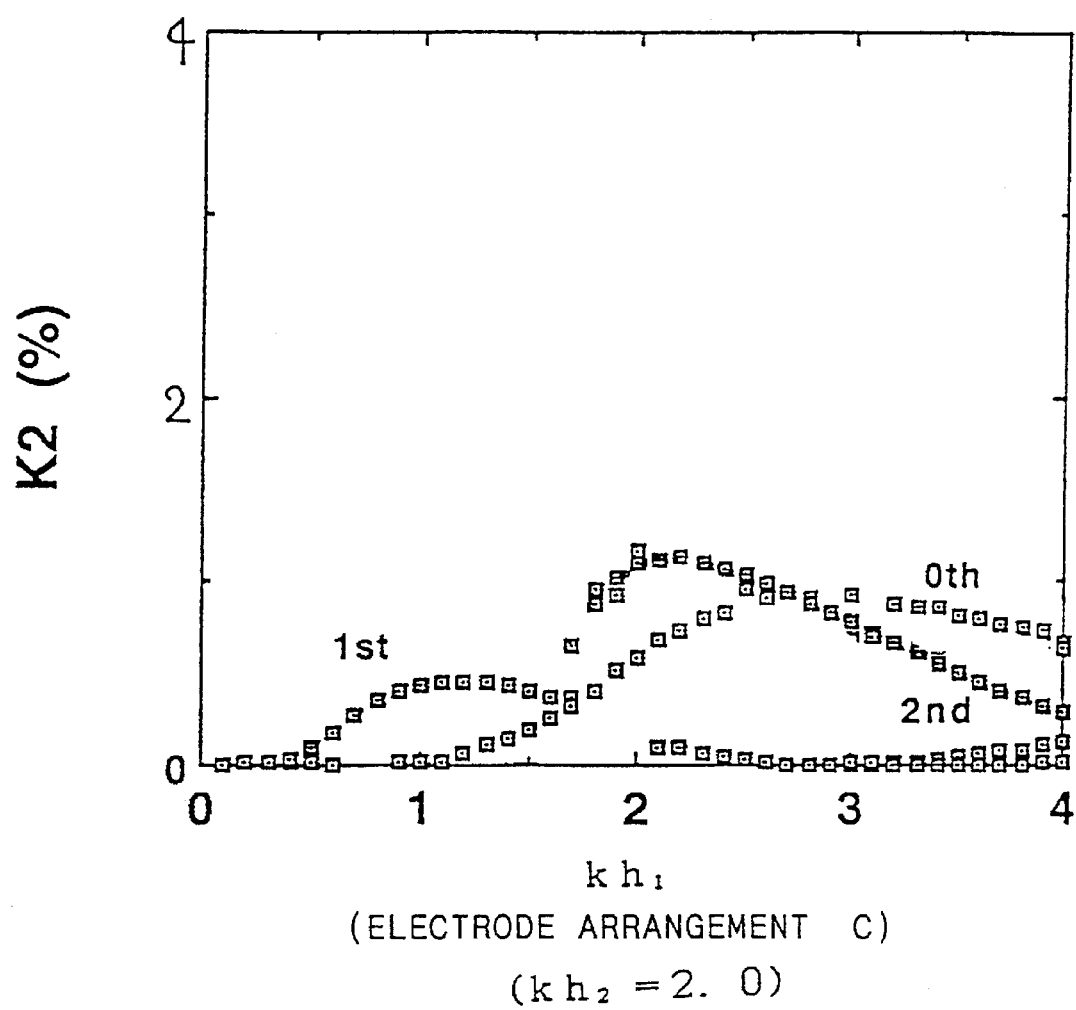
FIG. 16 is a graph showing a relationship of the effective coupling coefficient $K^2$ with the parameter $kh_1$ in a SAW device having the "Layer Structure 2" and the "Electrode Arrangement C" (the parameter $kh_2 = 2.0$).
Figure 17:
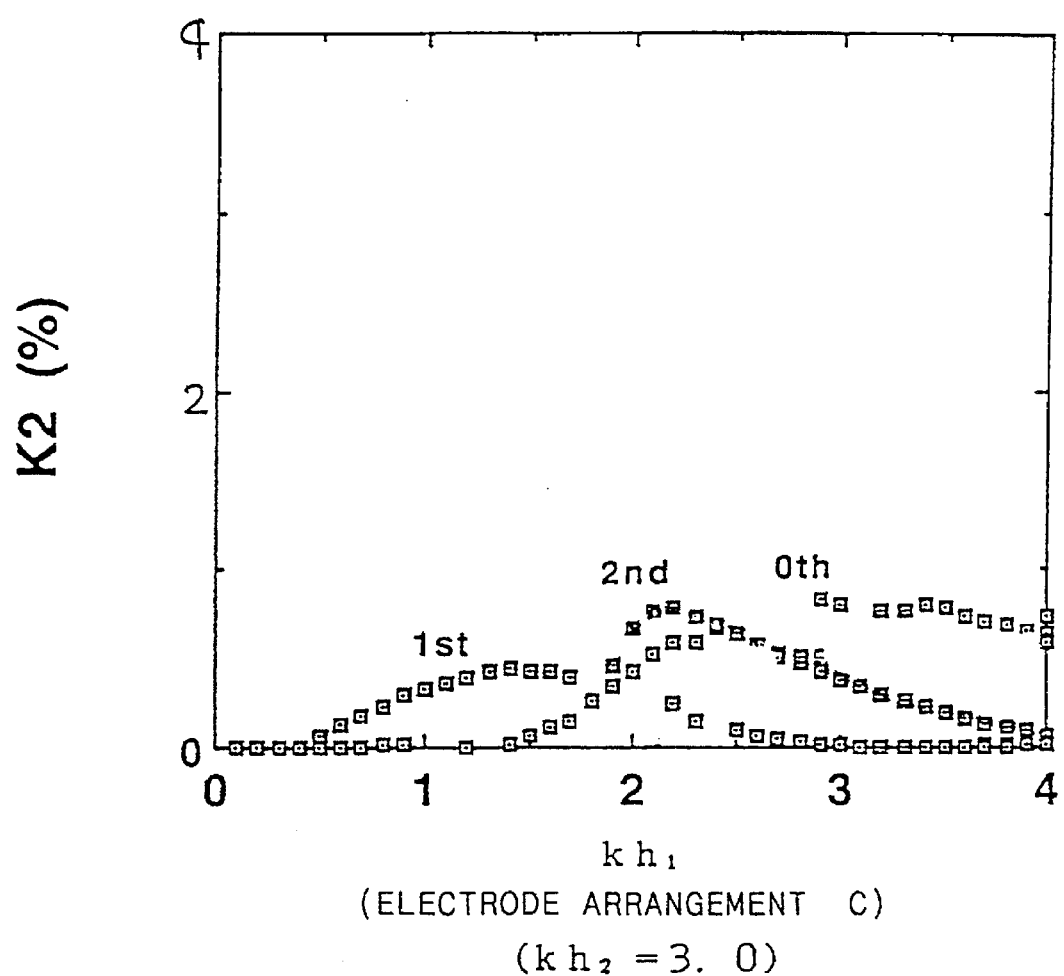
FIG. 17 is a graph showing a relationship of the effective coupling coefficient $K^2$ with the parameter $kh_1$ in a SAW device having the "Layer Structure 2" and the "Electrode Arrangement C" (the parameter $kh_2 = 3.0$).

With respect to the SAW device of Electrode Arrangement C, the relationships of the effective coupling coefficient K$_2$ with the parameter kh$_1$ are shown in FIG. 15 (kh$_2$=1.0), FIG. 16 (kh$_2$=2.0) and FIG. 17 (kh$_2$=3.0), respectively.

Figure 18:
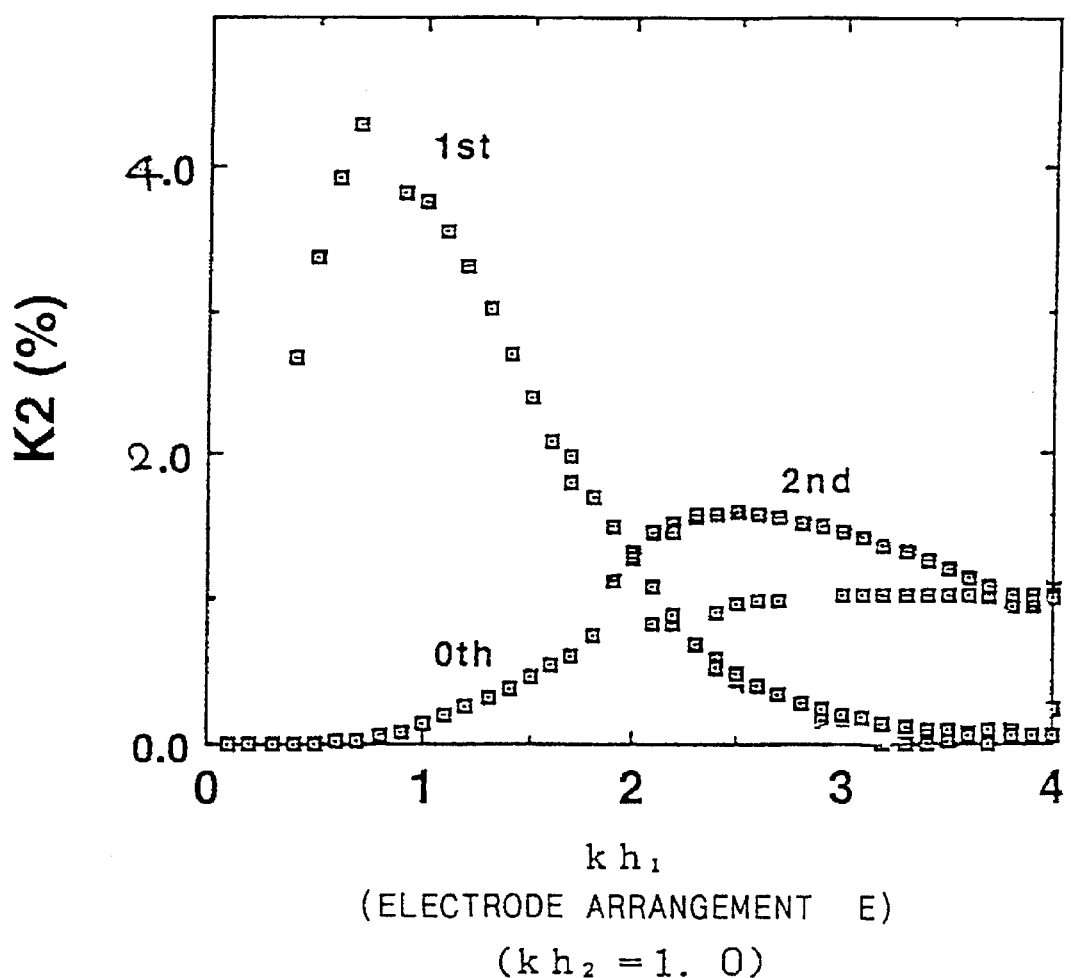
FIG. 18 is a graph showing a relationship of the effective coupling coefficient $K^2$ with the parameter $kh_1$ in a SAW device having the "Layer Structure 2" and the "Electrode Arrangement E" (the parameter $kh_2 = 1.0$).
Figure 19:
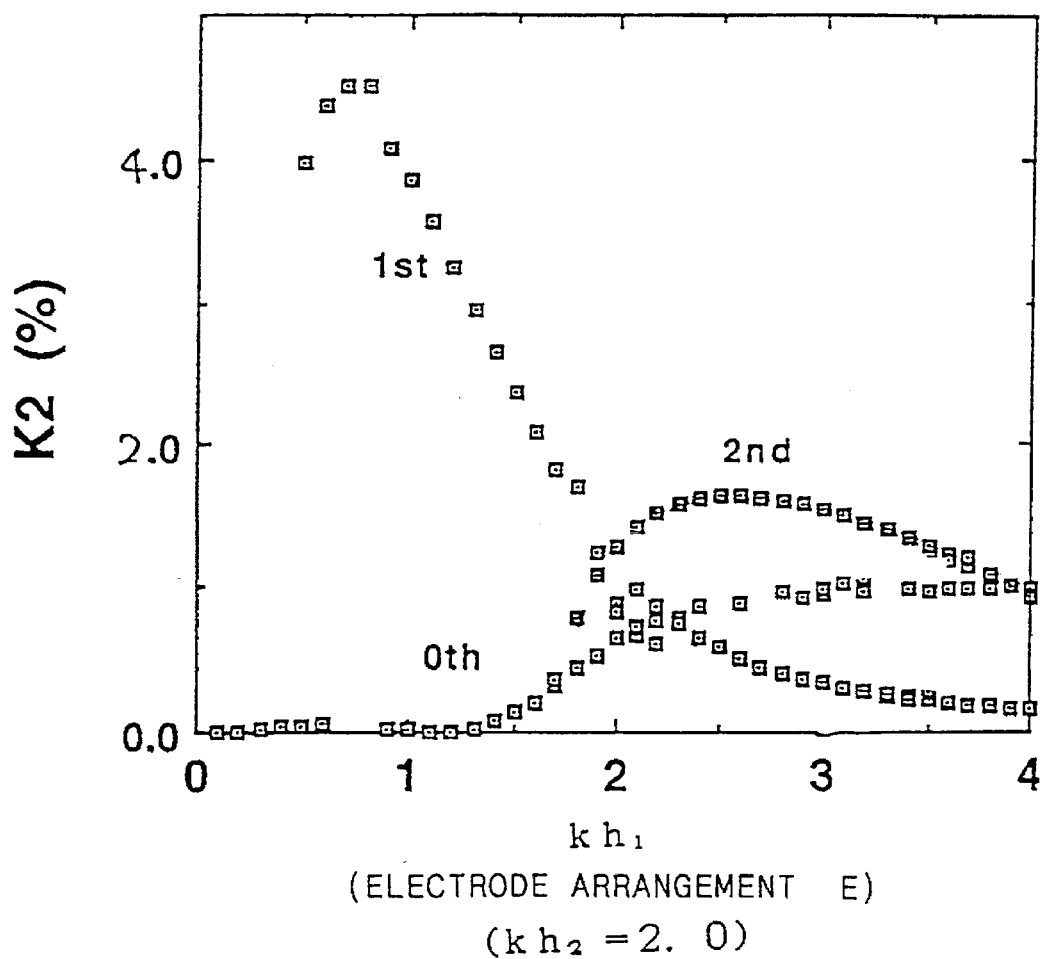
FIG. 19 is a graph showing a relationship of the effective coupling coefficient $K^2$ with the parameter $kh_1$ in a SAW device having the "Layer Structure 2" and the "Electrode Arrangement E" (the parameter $kh_2 = 2.0$).
Figure 20:
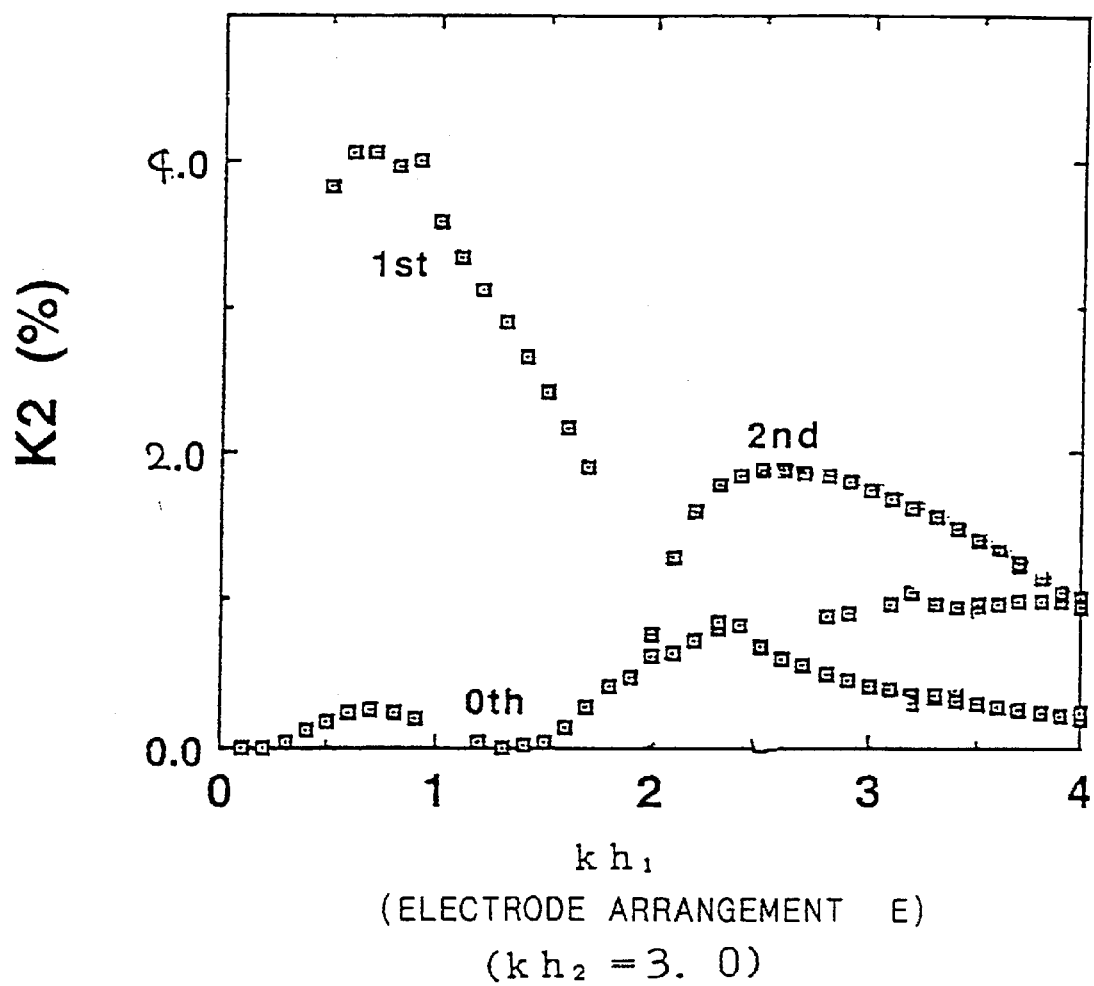
FIG. 20 is a graph showing a relationship of the effective coupling coefficient $K^2$ with the parameter $kh_1$ in a SAW device having the "Layer Structure 2" and the "Electrode Arrangement E" (the parameter $kh_2 = 3.0$).

With respect to the SAW device of Electrode Arrangement E, the relationships of the effective coupling coefficient K$_2$ with the parameter kh$_1$ are shown in FIG. 18 (kh$_2$=1.0), FIG. 19 (kh$_2$=2.0) and FIG. 20 (kh$_2$=3.0), respectively.

Figure 21:
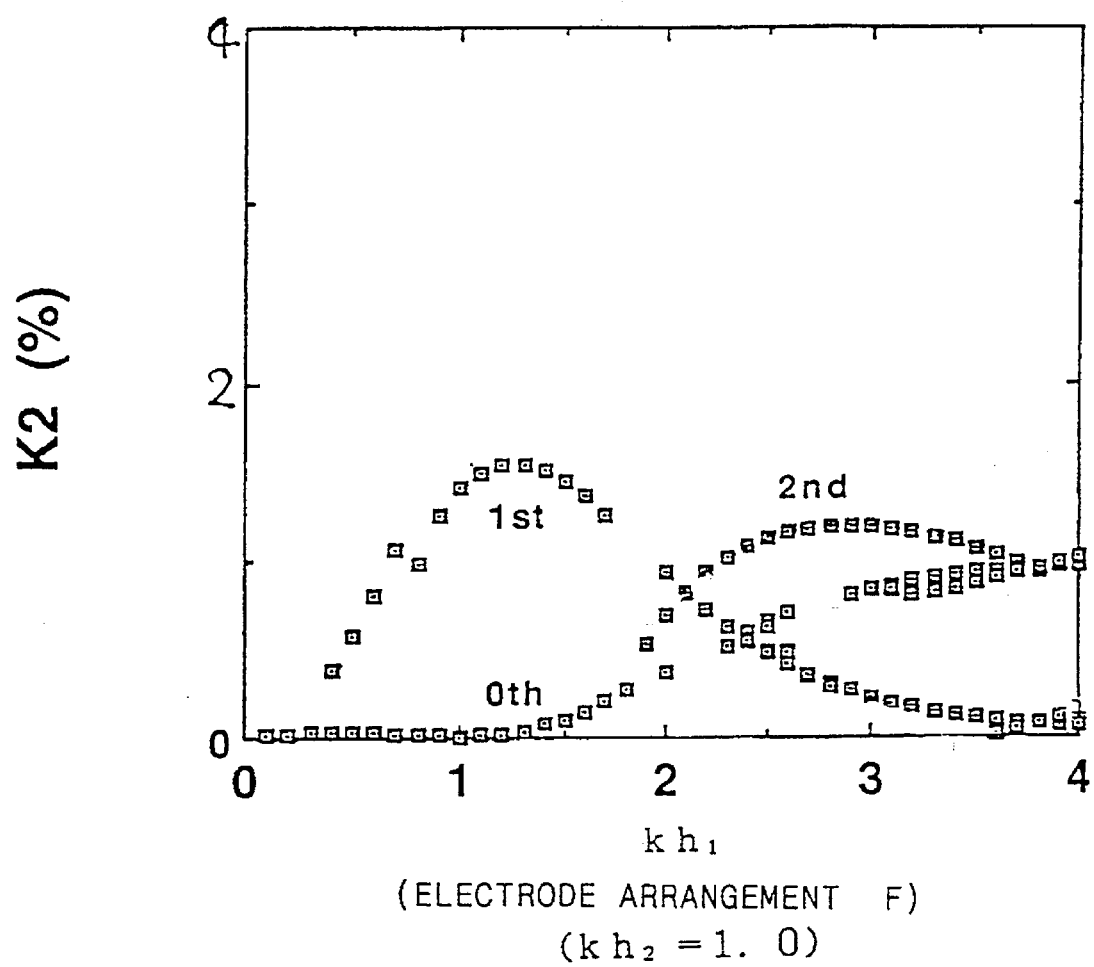
FIG. 21 is a graph showing a relationship of the effective coupling coefficient $K^2$ with the parameter $kh_1$ in a SAW device having the "Layer Structure 2" and the "Electrode Arrangement F" (the parameter $kh_2 = 1.0$).
Figure 22:
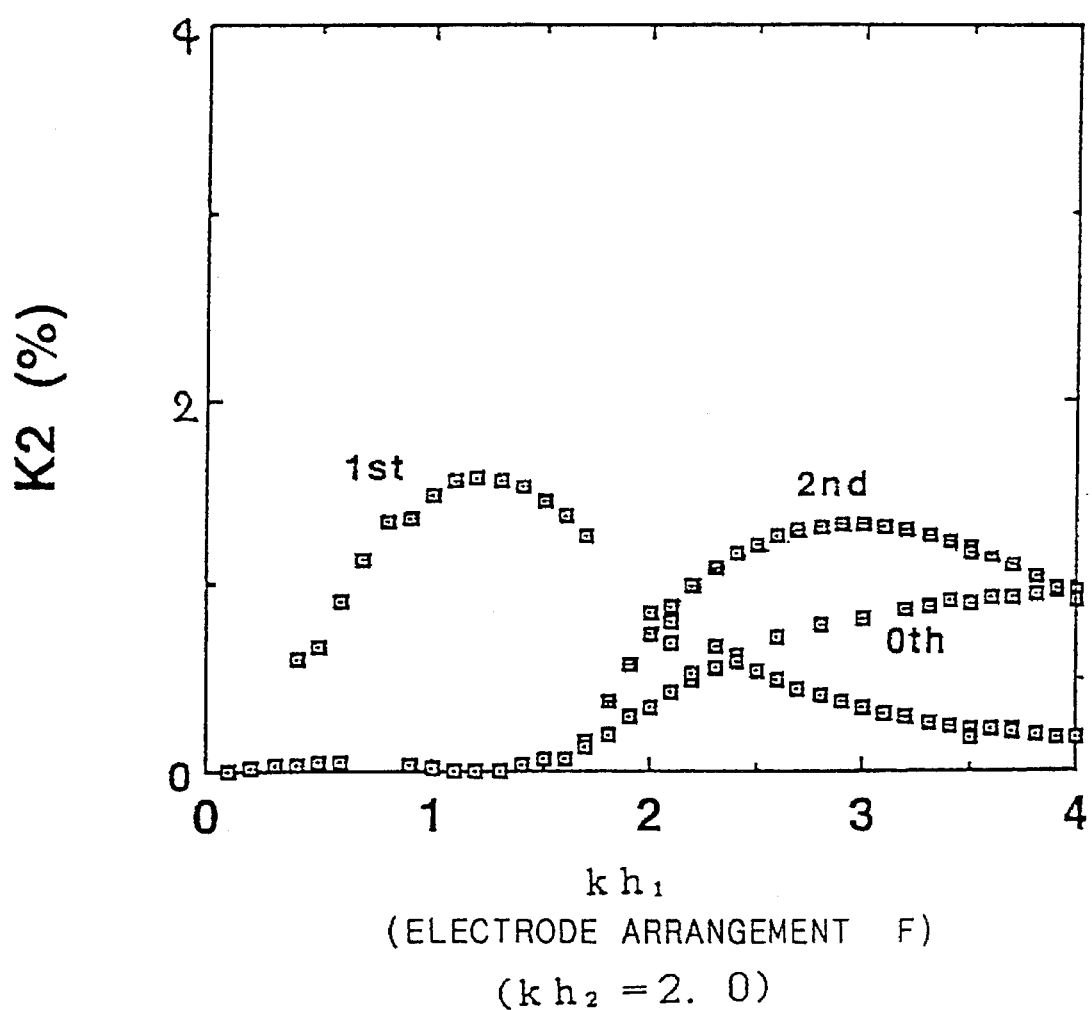
FIG. 22 is a graph showing a relationship of the effective coupling coefficient $K^2$ with the parameter $kh_1$ in a SAW device having the "Layer Structure 2" and the "Electrode Arrangement F" (the parameter $kh_2 = 2.0$).
Figure 23:
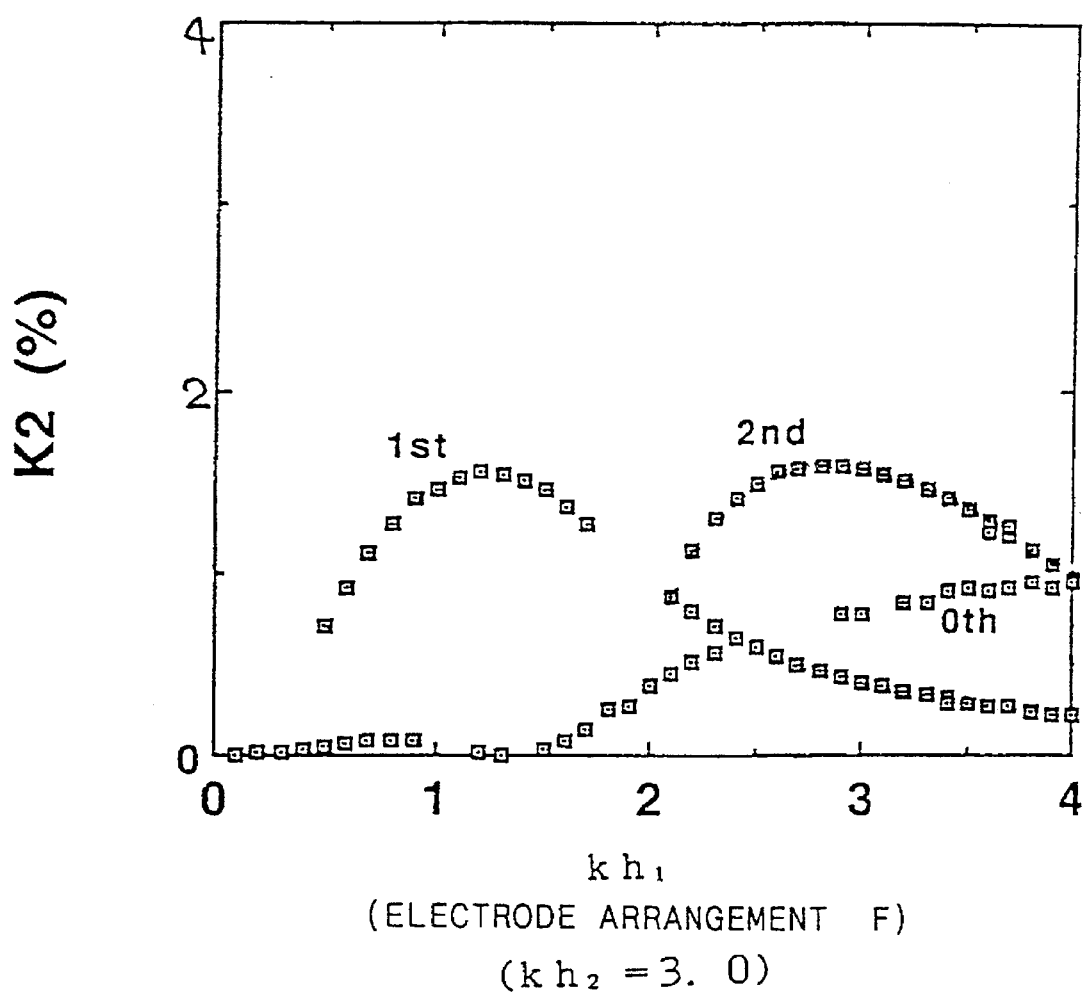
FIG. 23 is a graph showing a relationship of the effective coupling coefficient $K^2$ with the parameter $kh_1$ in a SAW device having the "Layer Structure 2" and the "Electrode Arrangement F" (the parameter $kh_2 = 3.0$).

With respect to the SAW device of Electrode Arrangement F, the relationships of the effective coupling coefficient $K_2$ with the parameter $kh_1$ are shown in FIG. 21 ($kh_2=1.0$), FIG. 22 ($kh_2=2.0$) and FIG. 23 ($kh_2=3.0$), respectively.

Consequently, it is shown that the SAW devices of Example 1 have sufficient propagation velocity V of SAW ($V \geq 7000$ m/s) and excellent effective coupling coefficient $K_2$ ($K_2 \geq 2\%$), for specific modes of wave and specific electrode arrangements.

Example 2

Four types of SAW devices of different layer/IDT constitution were prepared, and the desired diamond/LiTaO₃ layer thickness for each constitution/each mode of SAW were evaluated to give sufficient propagation velocity (V) and excellent effective coupling coefficient $K^2$, by use of the parameter $kh_1$ and $kh_2$.

The four types of the SAW devices of the Example 2 are:

(1) SAW device having Layer Structure 1 as illustrated in FIG. 3, and an Electrode Arrangement A as illustrated in FIG. 5;

(2) SAW device having Layer Structure 1 as illustrated in FIG. 3, and an Electrode Arrangement C as illustrated in FIG. 6;

(3) SAW device having Layer Structure 1 as illustrated in FIG. 3, and an Electrode Arrangement E as illustrated in FIG. 7;

(4) SAW device having Layer Structure 1 as illustrated in FIG. 3, and an Electrode Arrangement F as illustrated in FIG. 8.

An aluminum IDTs having planer shape of double-type electrode as shown in FIG. 2 (electrode element width d=1 μm, pitch=8 μm, thickness=400 Angstrom) was formed on each side of (100) surface of monocrystalline diamond (natural type diamond, Type-Ia), and thereafter an LiTaO₃ film (film thickness: 0.13–5.1 μm, 40 thicknesses) was formed over the IDTs by RF magnetron sputtering in the same procedure and processing conditions as in Example 1, thereby to fabricate SAW device having a layer structure (Layer Structure 1) as shown in FIG. 3, and an electrode arrangement (Electrode Arrangement A) as shown in FIG. 5 (input IDT: 30 electrode pairs, output IDT: 30 electrode pairs, distance between centers of input and output electrodes: 400 μm). All of the formed LiTaO₃ films were C-axis-oriented films, and the σ value of the X-ray rocking curve of each LiTaO₃ film was 2°–3°.

The four types of SAW devices described above were prepared in the same procedure and the same process conditions of the Example 1.

Radio frequency was applied to the input IDT to generate SAW in the same manner as in Example 1. The propagation velocities V (m/s) of the thus generated SAWs of respective modes, the electromechanical coupling coefficient ($K^2$), and the thickness $t_1$ (μm) of the LiTaO₃ layer were evaluated in the same manner as in the Example 1.

On the basis of the obtained data, a parameter of $kh_1=2\pi(t_1/\lambda)$ was evaluated with respect to each of the SAW devices having a layer structure (Layer Structure 1) shown in FIG. 3, and an electrode arrangement (any of Electrode Arrangements A, C, E and F) shown in FIGS. 5–8 ($\lambda=8$ μm).

Figure 24:
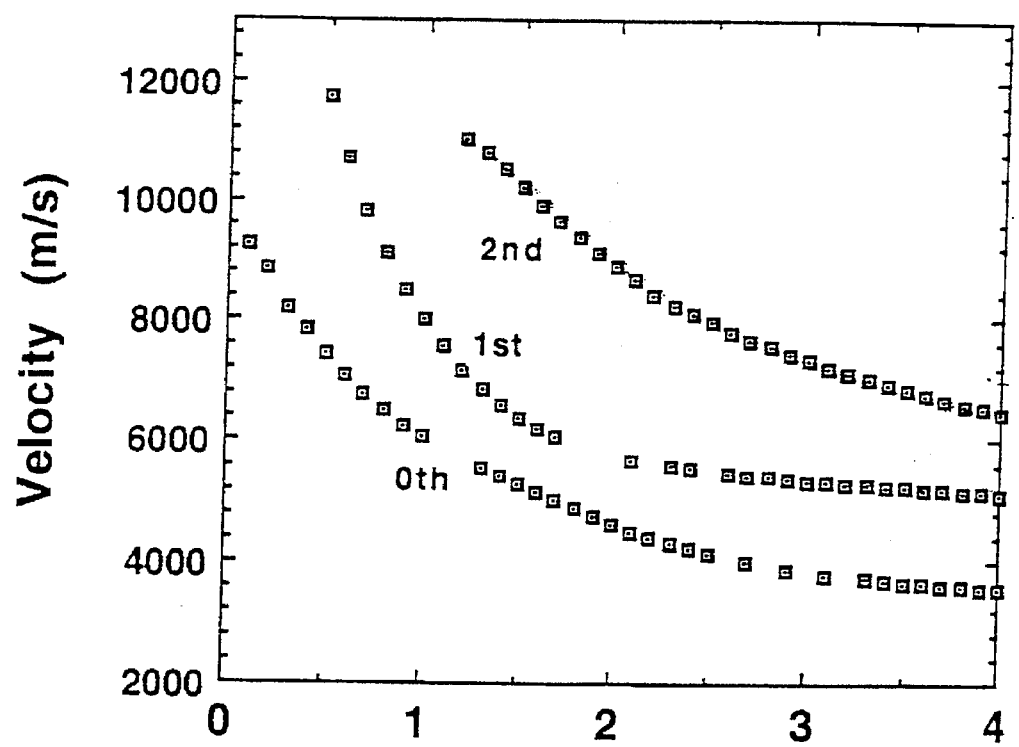
FIG. 24 is a graph showing a relationship of the propagation velocity V of SAW with the parameter $kh_1$ in a SAW devices having the "Layer Structure 1 and 2" and the "Electrode Arrangement A, C, E or F" (the parameter $kh_2 = 4.0, 6.0$ or $8.0$).

The relationships of the propagation velocity V with the parameter $kh_1=2\pi(t_1/\lambda)$ which had been determined in the same manner as in the Example 1 are shown in FIG. 24. The FIG. 24 also includes the relationships of the V with $kh_1$ for the SAW devices of the Example 1, which have the Layer Structure 1 and the Electrode Arrangement A, C, E and F ($\lambda=8$ μm, $kh_2=4.0$, 6.0 and 8.0, respectively), for reference.

Figure 25:
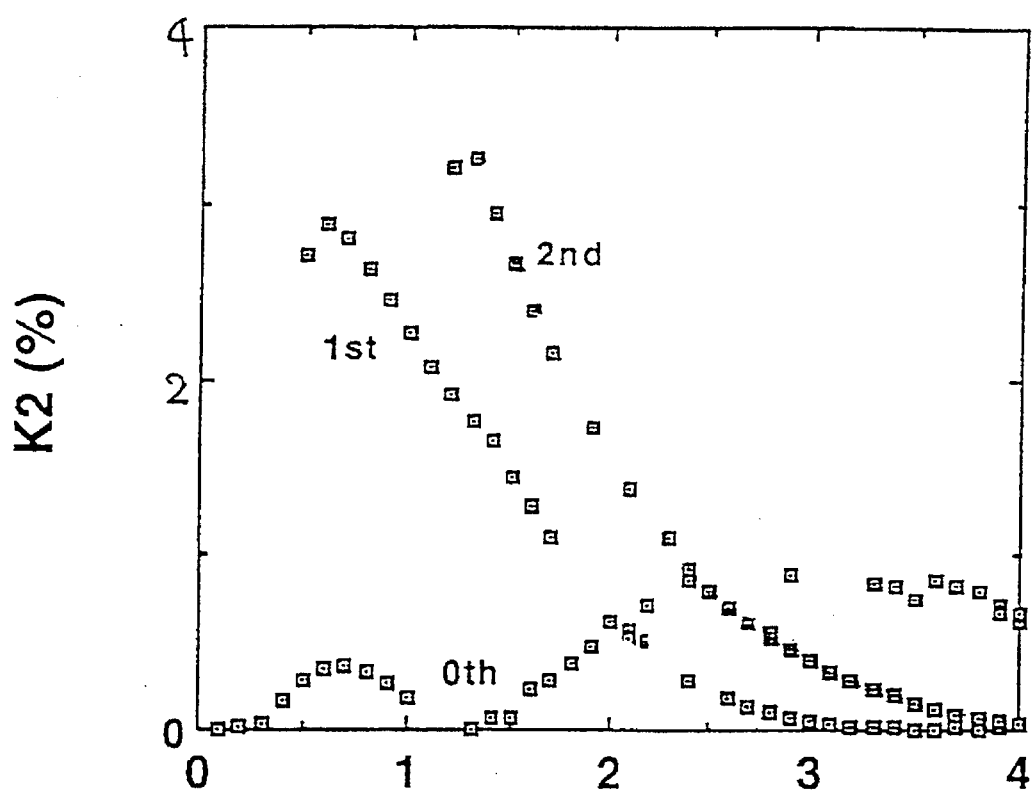
FIG. 25 is a graph showing a relationship of the effective coupling coefficient $K^2$ with the parameter $kh_1$ in a SAW devices having the "Layer Structure 1 and 2" and the "Electrode Arrangement A" (the parameter $kh_2 = 4.0, 6.0$ or $8.0$).
Figure 26:
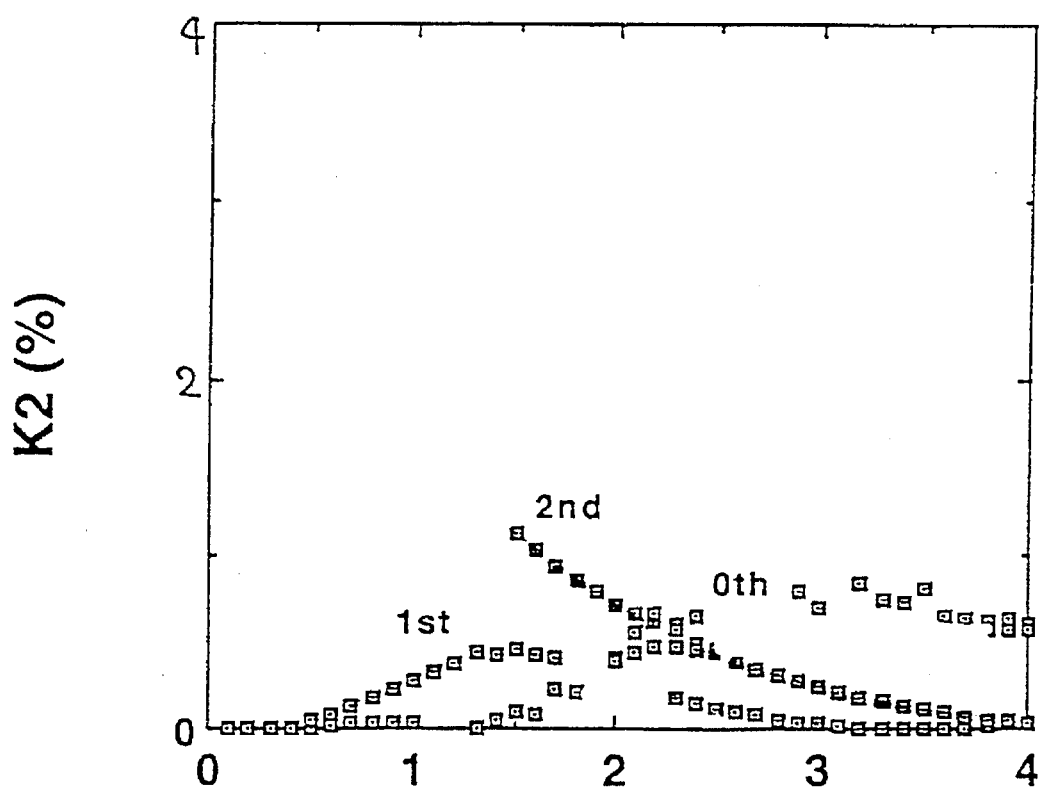
FIG. 26 is a graph showing a relationship of the effective coupling coefficient $K^2$ with the parameter $kh_1$ in a SAW devices having the "Layer Structure 1 and 2" and the "Electrode Arrangement C" (the parameter $kh_2 = 4.0, 6.0$ or $8.0$).
Figure 27:
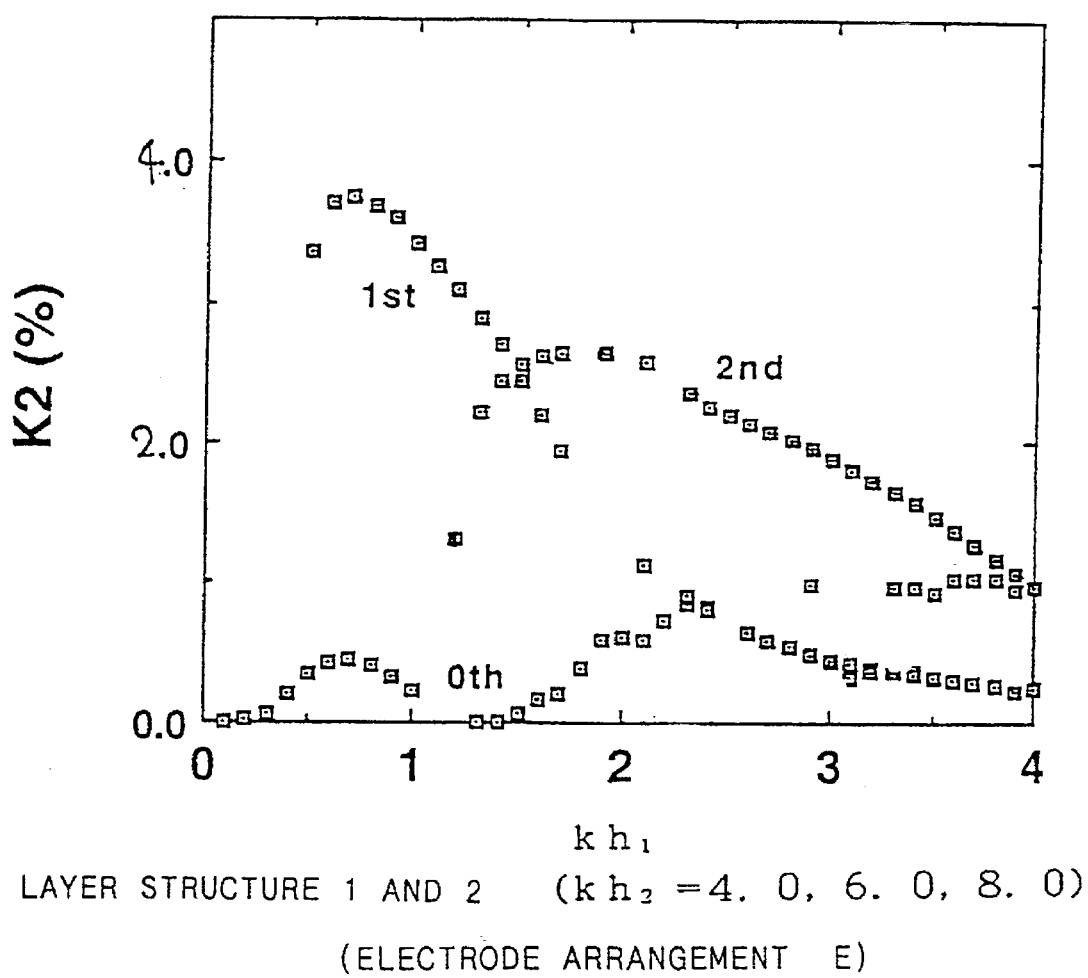
FIG. 27 is a graph showing a relationship of the effective coupling coefficient $K^2$ with the parameter $kh_1$ in a SAW devices having the "Layer Structure 1 and 2" and the "Electrode Arrangement E" (the parameter $kh_2 = 4.0, 6.0$ or $8.0$).
Figure 28:
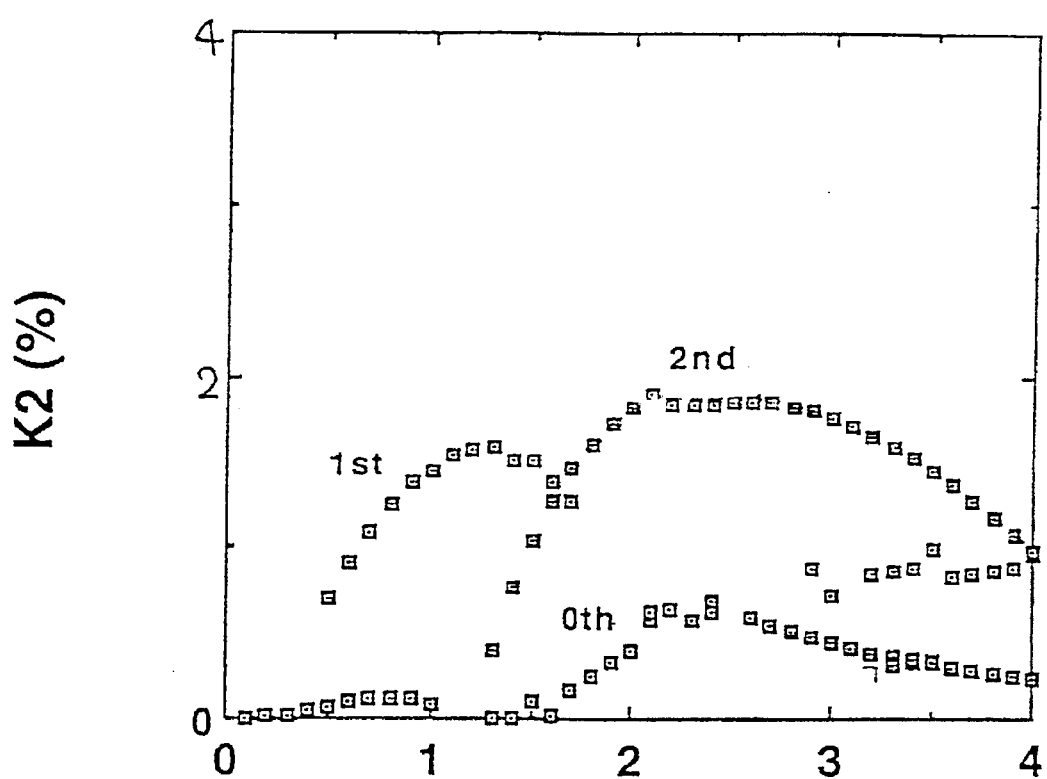
FIG. 28 is a graph showing a relationship of the effective coupling coefficient $K^2$ with the parameter $kh_1$ in a SAW device having the "Layer Structure 1 and 2" and the "Electrode Arrangement F" (the parameter $kh_2 = 4.0, 6.0$ or $8.0$).

The relationships of the effective coupling coefficient $K_2$ with the parameter $kh_1$ are shown in FIG. 25 (Electrode Arrangement A), FIG. 26 (Electrode Arrangement C), FIG. 27 (Electrode Arrangement E) and FIG. 28 (Electrode Arrangement F).

Consequently, it is shown that the SAW devices of Example 2 have sufficient propagation velocity V of SAW ($V \geq 7000$ m/s) and excellent effective coupling coefficient $K_2$ ($K_2 \geq 2\%$) for specific wave modes and electrode arrangements.

The basic Japanese Applications filed to the Japanese Patent Office on Jun. 16, 1994, No. 134515/1994 (Hei 6-134515); and filed to the Japanese Patent Office on Sep. 2, 1994, No. 210105/1994 (Hei 6-210105) are hereby incorporated by reference.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application Nos. 134515/1994 filed on Jun. 16, 1994 and 210105/1994 filed on Sep. 2, 1994 are hereby incorporated by reference.

What is claimed is:

1. A surface acoustic wave device for 1st mode surface acoustic wave of a wavelength $\lambda$(μm) comprising:

a diamond layer, an interdigital transducer formed onto the diamond layer, and a polycrystalline C-axis-oriented LiTaO₃ layer formed over the interdigital transducer;

said surface acoustic wave device satisfying a relationship of $0.4 \leq kh_1 \leq 1.0$, where the parameter $kh_1$ is defined as $kh_1=2\pi(t_1/\lambda)$, and $t_1$ (μm) is the thickness of the LiTaO₃ layer, and a relationship of $1 \leq kh_2$, where the parameter $kh_2$ is defined as $kh_2=2\pi(t_2/\lambda)$ and $t_2$ (μm) is the thickness of the diamond layer;

the surface acoustic wave propagation velocity V of said surface acoustic wave device being in the range of from 8,000 m/sec. to 12,000 m/sec.; and the effective coupling coefficient $K^2$ of said surface acoustic wave device being in the range of from 2.2% to 3.6%.

2. A surface acoustic wave device for 2nd mode surface acoustic wave of a wavelength $\lambda$(μm) comprising:

a diamond layer, an interdigital transducer formed onto the diamond layer, and a polycrystalline C-axis-oriented LiTaO₃ layer formed over the interdigital transducer;

said surface acoustic wave device satisfying a relationship of $1.2 \leq kh_1 \leq 1.8$, where the parameter $kh_1$ is defined as $kh_1=2\pi(t_1/\lambda)$, and $t_1$ (μm) is the thickness of the LiTaO₃ layer, and a relationship of $4 \leq kh_2$, where the parameter $kh_2$ is defined as $kh_2=2\pi(t_2/\lambda)$, and $t_2$ (μm) is the thickness of the diamond layer;

the surface acoustic wave propagation velocity V of said surface acoustic wave device being in the range of from 9,500 m/sec. to 11,000 m/sec.; and the effective coupling coefficient $K^2$ of said surface acoustic wave device being in the range of from 2.0% to 3.4%.

3. A surface acoustic wave device for 1st mode surface acoustic wave of a wavelength $\lambda(\mu m)$ comprising:

a diamond layer, a polycrystalline C-axis-oriented $LiTaO_3$ layer formed onto the diamond layer, and an interdigital transducer formed onto the $LiTaO_3$, layer;

said surface acoustic wave device satisfying a relationship of $0.4 \leq kh_1 \leq 1.0$, where the parameter $kh_1$ is defined as $kh_1=2\pi(t_1/\lambda)$, and $t_1$ ($\mu m$) is the thickness of the $LiTaO_3$ layer, and a relationship of $1 \leq kh_2$, where the parameter $kh_2$ is defined as $kh_2=2\pi(t_2/\lambda)$, and $t_2$ ($\mu m$) is the thickness of the diamond layer;

the surface acoustic wave propagation velocity V of said surface acoustic wave device being in the range of from 8,000 m/sec. to 12,000 m/sec.; and the effective coupling coefficient $K^2$ of said surface acoustic wave device being in the range of from 3.4% to 4.4%.

4. A surface acoustic wave device for 2nd mode surface acoustic wave of a wavelength $\lambda(\mu m)$ comprising:

a diamond layer, a polycrystalline C-axis oriented $LiTaO_3$ layer formed onto the diamond layer, and an interdigital transducer formed onto the $LiTaO_3$ layer;

said surface acoustic wave device satisfying a relationship of $1.3 \leq kh_1 \leq 1.8$, where the parameter $kh_1$ is defined as $kh_1=2\pi(t_1/\lambda)$, and $t_1$ ($\mu m$) is the thickness of the $LiTaO_3$ layer, and a relationship of $4 \leq kh_2$, where the parameter $kh_2$ is defined as $kh_2=2\pi(t_2/\lambda)$, and $t_2$ ($\mu m$) is the thickness of the diamond layer;

the surface acoustic wave propagation velocity V of said surface acoustic wave device being in the range of from 9,500 m/sec. to 10,700 m/sec.; and the effective coupling coefficient $K^2$ of said surface acoustic wave device being in the range of from 2.2% to 2.7%.

5. A surface acoustic wave device according to claim 1, wherein said polycrystalline c-axis oriented $LiTaO_3$ layer has a standard deviation of x-ray diffraction pattern rocking curve of from 2° to 3°.

6. A surface acoustic wave device according to claim 2, wherein said polycrystalline c-axis oriented $LiTaO_3$ layer has a standard deviation of x-ray diffraction pattern rocking curve of from 2° to 3°.

7. A surface acoustic wave device according to claim 3, wherein said polycrystalline c-axis oriented $LiTaO_3$ layer has a standard deviation of x-ray diffraction pattern rocking curve of from 2° to 3°.

8. A surface acoustic wave device according to claim 4, wherein said polycrystalline c-axis oriented $LiTaO_3$ layer has a standard deviation of x-ray diffraction pattern rocking curve of from 2° to 3°.

* * * * *